US012566228B2

(12) United States Patent
Theis et al.

(10) Patent No.: US 12,566,228 B2
(45) Date of Patent: Mar. 3, 2026

(54) TEMPERATURE CYCLING METHOD FOR HYPERPOLARIZATION OF TARGET MOLECULES AND CONTRAST AGENTS USING PARAHYDROGEN

(71) Applicants: NORTH CAROLINA STATE UNIVERSITY, Raleigh, NC (US); WAYNE STATE UNIVERSITY, Detroit, MI (US); BOARD OF TRUSTEES OF SOUTHERN ILLINOIS UNIVERSITY, Carbondale, IL (US); NATIONAL INSTITUTES OF HEALTH, NHLBI, Rockville, MD (US)

(72) Inventors: Thomas Theis, Raleigh, NC (US); Mustapha Abdulmojeed, Raleigh, NC (US); Sören Lehmkuhl, Raleigh, NC (US); Patrick TomHon, Raleigh, NC (US); Iuliia Mandzhieva, Raleigh, NC (US); Eduard Y. Chekmenev, Detroit, MI (US); Isaiah Adelabu, Detroit, MI (US); Mohammad Kabir, Detroit, MI (US); Shiraz Nantogma, Detroit, MI (US); Jessica Ettedgui, Rockville, MD (US); Rolf Eric Swenson, Rockville, MD (US); Boyd Goodson, Carbondale, IL (US)

(73) Assignees: North Carolina State University, Raleigh, NC (US); Wayne State University, Detroit, MI (US); Board of Trustees of Southern Illinois University, Carbondale, IL (US); NATIONAL INSTITUTES OF HEALTH NHLBI, Rockville, MD (US)

( * ) Notice: Subject to any disclaimer, the term of this patent is extended or adjusted under 35 U.S.C. 154(b) by 253 days.

(21) Appl. No.: 18/291,681

(22) PCT Filed: Jul. 26, 2022

(86) PCT No.: PCT/US2022/074122
§ 371 (c)(1),
(2) Date: Jan. 24, 2024

(87) PCT Pub. No.: WO2023/009991
PCT Pub. Date: Feb. 2, 2023

(65) Prior Publication Data

US 2024/0255597 A1 Aug. 1, 2024

Related U.S. Application Data

(60) Provisional application No. 63/203,591, filed on Jul. 27, 2021.

(51) Int. Cl.
*G01R 33/46* (2006.01)

(52) U.S. Cl.
CPC ................................ *G01R 33/4608* (2013.01)

(58) Field of Classification Search
None
See application file for complete search history.

(56) References Cited

U.S. PATENT DOCUMENTS

| | | | | |
|---|---|---|---|---|
| 2010/0219826 A1* | 9/2010 | Duckett | A61K 49/06 | 324/307 |
| 2021/0252493 A1* | 8/2021 | Goodson | B01J 31/4038 | |
| 2023/0152398 A1* | 5/2023 | Theis | G01R 33/46 | 324/309 |

OTHER PUBLICATIONS

Colell, et al., Direct Hyperpolarization of Nitrogen-15 in Aqueous Media with Parahydrogen in Reversible Exchange, J. Am. Chem. Soc. 2017, 139, 7761-7767. (Year: 2017).*

(Continued)

*Primary Examiner* — Rodney E Fuller
(74) *Attorney, Agent, or Firm* — Thomas|Horstemeyer, LLP

(57) ABSTRACT

Hyperpolarized target molecules and contrast agents comprising the same, methods of making the same, and methods of imaging using same are provided. In a further aspect, imaging performed using the hyperpolarized target molecules and contrast agent can enable real time monitoring and diagnosis of diseases including various cancers and metabolic disorders. The methods are cryogen-free and inexpensive and can be performed in a short time.

20 Claims, 12 Drawing Sheets

2

(56) References Cited

OTHER PUBLICATIONS

Tomhon, et al., Temperature Cycling Enables Efficient 13C Sabre-Sheath Hyperpolarization and Imaging of [1-13C]-Pyruvate, J. Am. Chem. Soc. 2022, 144, 282-287. (Year: 2022).*

* cited by examiner

2

3b Free Pyv 3a

TEMPERATURE CYCLING METHOD FOR HYPERPOLARIZATION OF TARGET MOLECULES AND CONTRAST AGENTS USING PARAHYDROGEN

CROSS REFERENCE TO RELATED APPLICATIONS

This application is a U.S. national phase application under 35 U.S.C. 371 of International Patent Application No. PCT/US2022/074122, filed on Jul. 26, 2022, which claims the benefit of and priority to U.S. Provisional Application No. 63/203,591 filed on Jul. 27, 2021 both of which are incorporated herein by reference in their entireties.

STATEMENT REGARDING FEDERALLY SPONSORED RESEARCH OR DEVELOPMENT

This invention was made with government support under grant number EB029829 awarded by the National Institutes of Health and under grant numbers CHE1905341 and CHE1904780 awarded by the National Science Foundation. The government has certain rights in the invention.

BACKGROUND

Current metabolic imaging is dominated by PET and SPECT, but the emerging field of hyperpolarized MRI makes the tracking of biomolecular metabolism to elucidate disease states such as cancer in real time accessible beyond radio isotope imaging. Pyruvate has emerged as a leading initial candidate for hyperpolarized metabolic imaging due to its central role in metabolism. Specifically, pyruvate metabolism to lactate is emphasized in cancer cells, enabling early metabolic detection of cancer cells. However, the leading method to hyperpolarize pyruvate, dynamic nuclear polarization (DNP), is limited in scope due to its high cost, long contrast agent production times, and instrument complexity.

Previous work has demonstrated the feasibility of pyruvate hyperpolarization with SABRE but is limited in polarization relative to the high values of DNP (1.7% vs. ~60%). In vivo imaging of hyperpolarized contrast agents requires high SNR, previously demonstrated with >10% initial polarization.

Magnetic resonance imaging (MRI) is an invaluable tool for medical diagnostics, but common clinical MRI scanners currently only allow interpretation of structural anatomical features. However, many diseases manifest as metabolic responses far before diseased structural features emerge, opening a window for possible early diagnosis and treatment. Furthermore, patient responses to treatment can manifest as changes to local metabolism before corresponding changes become visible in anatomical images; thus, realization of metabolic imaging may provide earlier indications of treatment success or failure relative to conventional imaging. Current MRI scanners are unable to image these metabolic changes due to the combined low concentration and low thermal spin polarization ($P<0.001\%$) of these molecules. Hyperpolarization is a broad field that attempts to address these inherent limitations of traditional MRI, accessing high polarization ($P>1\%$) and enabling imaging of endogenous metabolites such as pyruvate at physiologically relevant concentrations.

Pyruvate is a specifically interesting biomolecule to the molecular imaging of disease states due to its central role in cancer metabolism, as one example. The Warburg effect is a commonly known metabolic transition in cancer cells where pyruvate to lactate conversion is upregulated in the anerobic environment of the cancer cells. Existing hyperpolarization methods such as dissolution dynamic nuclear polarization (dDNP) have demonstrated striking advancements in the application of hyperpolarized pyruvate to imaging cancer cells including in prostate, breast, and brain tissue. dDNP uses high electron polarization in a cryo-cooled superconducting magnet and/or high-power resonant microwaves to derive high nuclear spin polarization. While this technology has advanced to several late-stage clinical trials, these methods have remained limited in distribution due to the cost-prohibitive nature of the instrumentation (>$2 million) and the preparation time of the pyruvate contrast agent (~30 min).

An emerging alternative to dDNP is parahydrogen hyperpolarization (parahydrogen induced polarization, PHIP), where spin order is transferred from parahydrogen (p-$H_2$) to target substrates either through direct chemical addition or reversible interactions. PHIP has already been successfully demonstrated in preclinical in vivo studies, but these early demonstrations focus on the direct incorporation of p-$H_2$ to the target molecule, such as fumarate, or addition of p-$H_2$ to a precursor molecule and the rapidly converting the precursor to the desired substrate, such as the hydrogenation and hydrolysis of vinyl pyruvate to pyruvate. However, this side-arm hydrogenation (SAH) process is limited in scope by the cost of producing the vinyl pyruvate precursor and the complex spin transfer, hydrolysis, and phase transfer steps that are necessary after the SAH hyperpolarization. Signal amplification by reversible exchange (SABRE) is a different parahydrogen-based process that uses reversible interactions between p-$H_2$ derived hydrides and target substrates on an organometallic catalyst—in synchronization with substrate exchange on the catalyst—to transfer spin order from p-$H_2$ to a target substrate. SABRE is robust to a wide range of substrates that coordinate to a traditionally iridium metal center, and recently was utilized to produce pyruvate hyperpolarization using a DMSO co-ligand (FIG. 1).

However, optimized hyperpolarization levels of pyruvate demonstrated thus far (1.7%) are still far below the levels demonstrated by the comparable p-$H_2$ method of SAH-PHIP (5.2% observed, 9.4% nascent).

Despite advances in hyperpolarization research, there is still a scarcity of methods that allow for the hyperpolarization of pyruvate and other target molecules to a level compatible with real-time MRI imaging in subjects. Such methods would ideally enable preparation of contrast agents containing hyperpolarized target molecules in under 30 minutes without the need for expensive cryogenic equipment or high magnetic fields, thus allowing widespread use of the methods in medical and other research settings. These needs and other needs are satisfied by the present disclosure.

SUMMARY

In accordance with the purpose(s) of the present disclosure, as embodied and broadly described herein, the disclosure, in one aspect, relates to hyperpolarized target molecules and contrast agents comprising the same, methods of making the same, and methods of imaging using same. In a further aspect, imaging performed using the hyperpolarized target molecules and contrast agent can enable real time monitoring and diagnosis of diseases including various cancers and metabolic disorders. The methods are cryogen-free and inexpensive and can be performed in a short time.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

(FIG. 3D) Temperature deviation with different bubbling times for varied initial temperatures. (FIG. 3E) Temperature drift with variable bubbling time with an initial temperature of 0° C. (FIG. 3F) Hyperpolarization with and without field cycling. Initial temperature refers to the initial sample temperature before bubbling. All data was acquired with a 0.3 μT PTF and 100 psi p-$H_2$ at 75 sccm.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

Signal amplification by reversible exchange (SABRE) is a fast, cheap, and scalable hyperpolarization technique using parahydrogen as a source of spin order to enable metabolic imaging of pyruvate. Disclosed herein are new temperature cycling methods with the SABRE technique to access the polarization threshold of 10% with SABRE, accessing cryogen-free preparation of hyperpolarized pyruvate. Furthermore, optimization of the pyruvate SABRE process is possible to reach even higher polarization levels and increase the feasibility of future in vivo translation mirroring current clinical trials using hyperpolarized pyruvate for early cancer diagnosis and beyond.

Figures 2A, 2B:
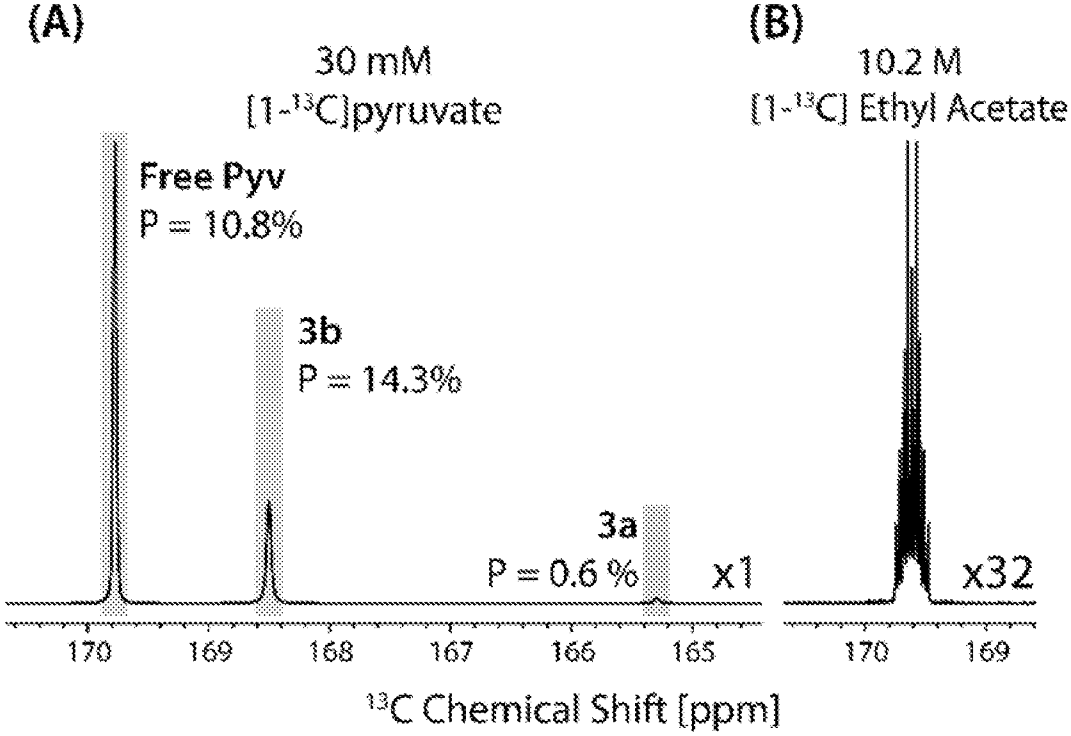
FIG. 2A shows top line results using new parameters for pyruvate hyperpolarization. This hyperpolarized spectrum was acquired with a sample of 30 mM [1-$^{13}$C]pyruvate, 20 mM DMSO, and 6 mM IMes catalyst.
FIG. 2B shows a thermal reference spectrum of [1-$^{13}$C]ethyl acetate at 9.4 T, used for calculation of the polarization.

Herein, the extension of previous SABRE methods is demonstrated to hyperpolarize pyruvate to show polarization levels >6× higher than previously realized with the SABRE method (see FIG. 2A). This new method uses temperature to modulate substrate and hydride exchange rates to reach higher polarization levels.

Disclosed herein is a temperature cycling method that enables >10% polarization on [1-$^{13}$C]-pyruvate and related molecules, sufficient for successful in vivo experiments. In an exemplary embodiment, at lower temperatures, ~15% polarization is accumulated on catalyst bound pyruvate, which is subsequently released into free pyruvate in solution at elevated temperatures. Further in this aspect, the temperature variation can be active and rapid, and the achieved polarization to can be used to provide $^{13}$C pyruvate images with a cryogen-free MRI system operated at 1 T. In a still further aspect, provided herein are inexpensive hyperpolarization methods can be combined with low-cost MRI systems to obtain a broadly available, yet highly sensitive metabolic imaging platform.

In one aspect, disclosed herein is a method for hyperpolarization of a target molecule, the method comprising: (a) transitioning a composition containing the target molecule and a polarization transfer catalyst between a first state and second state; and (b) contacting the composition with parahydrogen; wherein, in the first state, hydrogen exchange rates for the target molecule are from about 1 Hz to about 1000 Hz and substrate exchange is minimized or eliminated; and wherein, in the second state, rates of substrate exchange are up to about 100 Hz, and hydrogen exchange rates for the target molecule are comparable to rates of substrate exchange. In some aspects, the hyperpolarization is generated by signal amplification by reversible exchange (SABRE). In any of these aspects, the composition can be returned to the first state and the transitioning can be repeated one or more times. In some aspects, the method further includes (c) exposing the composition to a magnetic field, wherein magnetic field strength is controlled by an external means. In another aspect, the external means can include a radio frequency coil, a shielding mechanism, a solenoid powered with direct current, a permanent magnet array, a superconducting magnet, or a combination thereof.

In an aspect, the target molecule can be a metabolite, a drug molecule, a vitamin, a pyruvate analog, a combination thereof, or a salt thereof, wherein the salt can be a sodium salt or a disodium salt. In another aspect, the pyruvate analog can be pyruvate, oxaloglutarate, oxaloacetate, phenyl pyruvate, 2-oxo-butyrate, 2,3-diketogluatarate, 2-oxo-adipate, or any combination thereof (see FIGS. 11A-11D). In another aspect, the target molecule can be acetonitrile, benzonitrile, α-cyano-4-hydroxycinnamic acid (CHCA), alectinib, metronidazole, dichloropyridazine, nicotinamide, imidazole, adenine, diphenyldiazene, diazirine, or any combination thereof, or can include a Schiff base, an $sp^2$ hybridized nitrogen atom, or any combination thereof. In one aspect, the target molecule can be

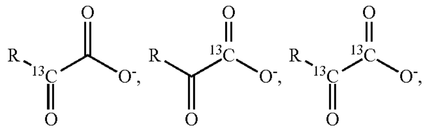

or any combination thereof;

wherein R is selected from substituted or unsubstituted C1-C10 alkyl, alkylaryl, aryl, heteroalkyl, heteroaryl, or any combination thereof.

In another aspect, the first state represents a low temperature and the second state represents a high temperature. In another aspect, the low temperature and the high temperature can be, respectively, about −100° C. and 100° C., or about −50° C. and 100° C., or about −10° C. and about 25° C., or a combination of any of the foregoing values, or a range encompassing any of the foregoing values.

In another aspect, the parahydrogen used to contact the composition can have at least 50% purity, or at least 90% purity, or can have about 50, 55, 60, 65, 70, 76, 80, 85, 90, or about 95% purity, or a combination of any of the foregoing values, or a range encompassing any of the foregoing values. In another aspect, the parahydrogen has a pressure of from about 50 psi (345 kPa) to about 500 psi (3447 kPa), or of from about 75 psi (517 kPa) to about 200 psi (1379 kPa), or of about 100 psi (690 kPa), or a combination of any of the foregoing values, or a range encompassing any of the foregoing values. In another aspect, the parahydrogen can contact the composition for from about 1 s to about 150 s, or from about 15 s to about 90 s, or a combination of any of the foregoing values, or a range encompassing any of the foregoing values. In one aspect, contact with parahydrogen can cause the transitioning from the first state to the second state. In one aspect, the composition can be contacted with parahydrogen by bubbling parahydrogen through the composition, through delivery of parahydrogen via a semipermeable membrane, or any combination thereof. In one aspect, the parahydrogen can be bubbled at a rate of from about 30 to 4000 sccm, or from about 60 to about 200 sccm, or at about 75 sccm.

In another aspect, contacting the composition with parahydrogen can be carried out in a polarization transfer field of from about −30 μT to about 30 μT, or of from about 0.3 to about 0.4 μT, or of from about 0.1 mT to about 20 mT, or a combination of any of the foregoing values, or a range encompassing any of the foregoing values.

In an aspect, the low temperature is imparted to the composition in a cooling apparatus. Further in this aspect, the composition can be removed from the cooling apparatus prior to contacting the composition with parahydrogen. In still another aspect, the removal can be accomplished by a mechanical means such as, for example, pneumatic shuttling or microfluidic shuttling using pressure, or can be accomplished manually.

In some aspects, the composition can further include a co-ligand such as, for example, DMSO, ammonia, benzylamine, water, or any combination thereof. In one aspect, the ratio of target molecule to co-ligand can be about 5:3.3.

In another aspect, the polarization transfer catalyst can include a metal center coordinated with an organic ligand, wherein the metal center can be iridium, rhodium, cobalt, or any combination thereof. In another aspect, the polarization transfer catalyst can be an N-heterocyclic carbene-based iridium catalyst, Crabtree's catalyst, 11,3-bis(2,4,6-trimethylphenyl) imidazole-2-ylidene (IMes), a derivative thereof, or any combination thereof.

In one aspect, the composition can include from about 5 to about 100 mM target molecule, about 1-20 mM of the polarization transfer catalyst, and, if present, about 5-100 mM of the co-ligand, or can include from about 30 to about 75 mM target molecule, about 6 mM polarization transfer catalyst, and, if present, about 20 mM co-ligand, or can include from about 30 to about 60 mM target molecule.

In some aspects, the target molecule can include at least one isotopic label, wherein the at least one isotopic label can be selected from spin ½ nuclei such as, for example, $^{13}C$, $^{15}N$, $^{19}F$, $^{1}H$, $^{31}P$, or any combination thereof.

In another aspect, the composition can further include a solvent. In some aspects, the solvent can be a deuterated solvent, a protonated solvent, or any combination thereof. In yet another aspect, the solvent can be selected from water, methanol, ethanol, chloroform, acetic acid, acetone, acetonitrile, benzene, methylene chloride, pyridine, or any combination thereof.

In one aspect, the target molecule can be present in a total amount consisting of a first proportion and a second proportion, wherein the first proportion of the target molecule is free in solution and wherein the second proportion of the target molecule can be bound to the polarization transfer catalyst. In a further aspect, individual molecules can transfer from the first proportion to the second proportion or from the second proportion to the first proportion, and the first proportion and the second proportion can vary.

In any of these aspects, the method can result in a hyperpolarization percentage of greater than about 1% for the total amount of the target molecule or of greater than about 11% for the total amount of the target molecule. In a still further aspect, the hyperpolarization percentage for the first proportion of the target molecule can be greater than about 10% and the hyperpolarization percentage of the second proportion of the target molecule can be greater than about 14%.

Also disclosed are hyperpolarized target molecules prepared according to the disclosed methods and contrast agents containing the hyperpolarized target molecules. In some aspects, the contrast agents can be prepared in under 30 minutes, or in under 10 minutes.

Further disclosed herein are methods for diagnosing a disease or monitoring the progress of treatment of a disease in a subject, the method including (a) administering the hyperpolarized target molecule or contrast agent to the subject and (b) performing imaging on the subject, wherein performing imaging enables visualization of the hyperpolarized target molecule in the subject. In one aspect, the subject can be a mammal such as, for example, a human, mouse, rat, hamster, pig, guinea pig, sheep, dog, cat, or horse.

In one aspect, in the processes disclosed herein, at least one processing or purification step can be performed on the hyperpolarized target molecule prior to administering the hyperpolarized target molecule or contrast agent to the subject. In another aspect, the processing or purification step can be filtration, catalyst removal, solvent exchange, pH adjustment, temperature adjustment, or any combination thereof.

In another aspect, the hyperpolarized target molecule can be administered to the subject in a single injection, or can be administered to the subject continuously for from about 30 seconds to about 30 minutes. In any of these aspects, the disease can be cancer such as, for example, prostate cancer, breast cancer, or brain cancer, or can be a metabolic disorder such as, for example, diabetes, pyruvate dehydrogenase complex deficiency, or pyruvate carboxylase deficiency. In still another aspect, the disease can be cardiovascular disease. In a still further aspect, the imaging can be magnetic resonance imaging (MRI). In another aspect, the magnetic resonance imaging can be carried out using a cryogen-cooled superconducting MRI magnet or a cryogen-free MRI magnet.

Many modifications and other embodiments disclosed herein will come to mind to one skilled in the art to which the disclosed compositions and methods pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The skilled artisan will recognize many variants and adaptations of the aspects described herein. These variants and adaptations are intended to be included in the teachings of this disclosure and to be encompassed by the claims herein.

Although specific terms are employed herein, they are used in a generic and descriptive sense only and not for purposes of limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

Prior to describing the various aspects of the present disclosure, the following definitions are provided and should be used unless otherwise indicated. Additional terms may be defined elsewhere in the present disclosure.

Definitions

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by," "comprising," "comprises," "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used in the specification and the appended claims, the singular forms "a," "an" and "the" include plural referents unless the context clearly dictates otherwise. Thus, for example, reference to "a solvent," "a polarization transfer catalyst," or "a co-ligand," include, but are not limited to, mixtures or combinations of two or more such solvents, polarization transfer catalysts, or co-ligands, and the like.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y.' The range can also be expressed as an upper limit, e.g. 'about x, y, z, or less' and should be interpreted to include the specific ranges of 'about x,' 'about y', and 'about z' as well as the ranges of 'less than x', less than y', and 'less than z'. Likewise, the phrase 'about x, y, z, or greater' should be interpreted to include the specific ranges of 'about x,' 'about y,' and 'about z' as well as the ranges of 'greater than x,' greater than y,' and 'greater than z.' In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

As used herein, the term "effective amount" refers to an amount that is sufficient to achieve the desired modification of a physical property of the composition or material. For example, an "effective amount" of a polarization transfer catalyst refers to an amount that is sufficient to achieve the desired improvement in the property modulated by the formulation component, e.g. achieving the desired level of hyperpolarization. The specific level in terms of wt % in a composition required as an effective amount will depend upon a variety of factors including the amount and type of catalyst, amount and type of target molecule or substrate, amount and type of solvent, and presence and identity of any co-ligands.

As used herein, the terms "optional" or "optionally" means that the subsequently described event or circumstance can or cannot occur, and that the description includes instances where said event or circumstance occurs and instances where it does not.

Unless otherwise specified, temperatures referred to herein are based on atmospheric pressure (i.e. one atmosphere).

"Thermal polarization" as used herein refers to the fraction of nuclear spins that align with a magnetic field under normal conditions. This is typically a small number and can be measured in units of parts per million (ppm), even in a strong magnetic field.

By contrast, "hyperpolarization" refers to nuclear spin polarization far beyond thermal equilibrium conditions. In one aspect, hyperpolarization aligns almost all spins with the magnetic field, achieving signal enhancements of up to 10,000,000-fold when compared to thermal polarization.

"Orthohydrogen" (o-$H_2$) is an isomeric form of molecular hydrogen. In o-$H_2$, the spins of both nuclei are symmetrically aligned. In one aspect, at room temperature and thermal equilibrium, approximately 75% of an $H_2$ sample is in the orthohydrogen (triplet) state.

"Parahydrogen" (p-$H_2$) is a second isomeric form of molecular hydrogen. In p-$H_2$, the spins of both nuclei are anti-symmetrically aligned. In one aspect, at room temperature and thermal equilibrium, approximately 25% of an $H_2$ sample is in the parahydrogen (singlet) state. In a further aspect, use of parahydrogen exhibits hyperpolarized signals in NMR spectra. In one aspect, the reactor and process disclosed herein use parahydrogen to induce transfer spin in order to induce hyperpolarization in samples for NMR and MRI analysis. "Parahydrogen Induced Polarization" or "PHIP" is a hyperpolarization technique using p-$H_2$ as a source of spin transfer for inducing hyperpolarization. In one aspect, PHIP involves chemical reaction of p-$H_2$.

As used herein, a "cryogen-free magnet" can refer to a solid state magnet array or to a "dry" magnet that does not consume liquid helium or liquid nitrogen but rather uses compressed recycled helium, which can be liquefied, to cool the magnet.

"Signal amplification by reversible exchange" or "SABRE" is a technique that can increase the visibility of compounds for the purpose of NMR and MRI analysis, which in turn allows lower detection limits and shorter scan times in NMR, as well as higher contrast and higher resolution in MRI imaging. In one aspect, a metal-containing catalyst transfers spin from parahydrogen to a substrate, which can then be imaged or analyzed as appropriate.

As used herein, a "polarization transfer catalyst" is a metal containing catalyst that transiently binds both a substrate molecule and p-$H_2$, thereby allowing polarization to transfer from the p-$H_2$ to the substrate in a magnetic field. In some aspects, the metal in the polarization transfer catalyst is iridium. In another aspect, the iridium is typically coordinated with species containing aromatic rings and/or nitrogen heterocycles.

In some aspects, a “co-ligand” can be used in the disclosed methods. As used herein, “co-ligand” refers to a molecule capable of coordinating with the metal center in a polarization transfer catalyst. A co-ligand can, in some aspects, enhance polarization transfer efficiency to a target molecule, or can enhance binding efficiency of target molecules to the polarization transfer catalyst, or any combination thereof. Useful co-ligands disclosed herein include, but are not limited to, DMSO, water, and combinations thereof.

As used herein, “substrate” and “target molecule” refer to a molecule or chemical species to which polarization transfer is desired. Substrate and/or target molecules may be bound to a polarization transfer catalyst, may be free in solution, or a combination thereof.

As used interchangeably herein, “subject,” “individual,” or “patient” can refer to a vertebrate organism, such as a mammal (e.g. human). “Subject” can also refer to a cell, a population of cells, a tissue, an organ, or an organism, preferably to human and constituents thereof.

As used herein, the term “substituted” is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms “substitution” or “substituted with” include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

The term “alkyl” as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A “lower alkyl” group is an alkyl group containing from one to six (e.g., from one to four) carbon atoms. The term alkyl group can also be a C1 alkyl, C1-C2 alkyl, C1-C3 alkyl, C1-C4 alkyl, C1-C5 alkyl, C1-C6 alkyl, C1-C7 alkyl, C1-C8 alkyl, C1-C9 alkyl, C1-C10 alkyl, and the like up to and including a C1-C24 alkyl.

Throughout the specification “alkyl” is generally used to refer to both unsubstituted alkyl groups and substituted alkyl groups; however, substituted alkyl groups are also specifically referred to herein by identifying the specific substituent(s) on the alkyl group. For example, the term “halogenated alkyl” or “haloalkyl” specifically refers to an alkyl group that is substituted with one or more halide, e.g., fluorine, chlorine, bromine, or iodine. Alternatively, the term “monohaloalkyl” specifically refers to an alkyl group that is substituted with a single halide, e.g. fluorine, chlorine, bromine, or iodine. The term “polyhaloalkyl” specifically refers to an alkyl group that is independently substituted with two or more halides, i.e. each halide substituent need not be the same halide as another halide substituent, nor do the multiple instances of a halide substituent need to be on the same carbon. The term “alkoxyalkyl” specifically refers to an alkyl group that is substituted with one or more alkoxy groups, as described below. The term “aminoalkyl” specifically refers to an alkyl group that is substituted with one or more amino groups. The term “hydroxyalkyl” specifically refers to an alkyl group that is substituted with one or more hydroxy groups. When “alkyl” is used in one instance and a specific term such as “hydroxyalkyl” is used in another, it is not meant to imply that the term “alkyl” does not also refer to specific terms such as “hydroxyalkyl” and the like.

This practice is also used for other groups described herein. That is, while a term such as “cycloalkyl” refers to both unsubstituted and substituted cycloalkyl moieties, the substituted moieties can, in addition, be specifically identified herein; for example, a particular substituted cycloalkyl can be referred to as, e.g., an “alkylcycloalkyl.” Similarly, a substituted alkoxy can be specifically referred to as, e.g., a “halogenated alkoxy,” a particular substituted alkenyl can be, e.g., an “alkenylalcohol,” and the like. Again, the practice of using a general term, such as “cycloalkyl,” and a specific term, such as “alkylcycloalkyl,” is not meant to imply that the general term does not also include the specific term.

The term “cycloalkyl” as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term “heterocycloalkyl” is a type of cycloalkyl group as defined above, and is included within the meaning of the term “cycloalkyl,” where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term “aryl” as used herein is a group that contains any carbon-based aromatic group including, but not limited to, benzene, naphthalene, phenyl, biphenyl, anthracene, and the like. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, —$NH_2$, carboxylic acid, ester, ether, halide, hydroxy, ketone, azide, nitro, silyl, sulfo-oxo, or thiol as described herein. The term “biaryl” is a specific type of aryl group and is included in the definition of “aryl.” In addition, the aryl group can be a single ring structure or comprise multiple ring structures that are either fused ring structures or attached via one or more bridging groups such as a carbon-carbon bond. For example, biaryl to two aryl groups that are bound together via a fused ring structure, as in naphthalene, or are attached via one or more carbon-carbon bonds, as in biphenyl.

Now having described the aspects of the present disclosure, in general, the following Examples describe some additional aspects of the present disclosure. While aspects of the present disclosure are described in connection with the following examples and the corresponding text and figures, there is no intent to limit aspects of the present disclosure to this description. On the contrary, the intent is to cover all alternatives, modifications, and equivalents included within the spirit and scope of the present disclosure.

Aspects

The following list of exemplary aspects supports and is supported by the disclosure provided herein.

Aspect 1. A method for hyperpolarization of a target molecule, the method comprising:

(a) transitioning a composition comprising the target molecule and a polarization transfer catalyst between a first state and a second state; and (b) contacting the composition with parahydrogen;

wherein, in the first state, hydrogen exchange rates for the target molecule are from about 1 Hz to about 100 Hz and substrate exchange is minimized or eliminated; and wherein, in the second state, rates of substrate exchange are up to about 100 Hz, and hydrogen exchange rates for the target molecule are comparable to rates of substrate exchange.

Aspect 2. The method of aspect 1, wherein the hyperpolarization is generated by signal amplification by reversible exchange (SABRE).

Aspect 3. The method of aspect 1 or 2, further comprising returning the composition to the first state and repeating the transitioning one or more times.

Aspect 4. The method of any one of the preceding aspects, further comprising:

(c) exposing the composition to a magnetic field, wherein magnetic field strength is controlled by an external means.

Aspect 5. The method of aspect 4, wherein the external means comprises a radio frequency coil, a shielding mechanism, a solenoid powered with direct current, a permanent magnet array, a superconducting magnet, or a combination thereof.

Aspect 6. The method of any one of the preceding aspects, wherein the target molecule comprises a metabolite, a drug molecule, a vitamin, a pyruvate analog, a combination thereof, or a salt thereof.

Aspect 7. The method of aspect 6, wherein the salt comprises a sodium salt or a disodium salt.

Aspect 8. The method of aspect 6 or 7, wherein the pyruvate analog comprises pyruvate, oxaloglutarate, oxaloacetate, phenyl pyruvate, 2-oxo-butyrate, 2,3-diketogluatarate, 2-oxo-adipate, or any combination thereof.

Aspect 9. The method of any one of the preceding aspects, wherein the target molecule comprises acetonitrile, benzonitrile, α-cyano-4-hydroxycinnamic acid (CHCA), alectinib, metronidazole, dichloropyridazine, nicotinamide, imidazole, adenine, diphenyldiazene, diazirine, or any combination thereof.

Aspect 10. The method of any one of the preceding aspects, wherein the target molecule comprises a Schiff base, an $sp^2$ hybridized nitrogen atom, or any combination thereof.

Aspect 11. The method of any one of aspects 6-8, wherein target molecule comprises

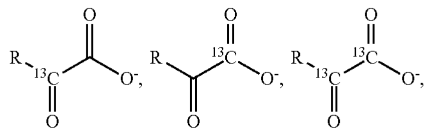

or any combination thereof;

wherein R is selected from substituted or unsubstituted C1-C10 alkyl, alkylaryl, aryl, heteroalkyl, heteroaryl, or any combination thereof.

Aspect 12. The method of aspect 11, wherein the target molecule comprises

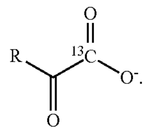

Aspect 13. The method of any one of the preceding aspects, wherein the first state represents a low temperature and the second state represents a high temperature.

Aspect 14. The method of aspect 13, wherein the low temperature is about −100° C. and the high temperature is about 100° C.

Aspect 15. The method of aspect 13, wherein the low temperature is about −50° C. and the high temperature is about 100° C.

Aspect 16. The method of aspect 13, wherein the low temperature is about −10° C. and the high temperature is about 25° C.

Aspect 17. The method of any one of the preceding aspects, wherein the parahydrogen has at least 50% purity.

Aspect 18. The method of aspect 17, wherein the parahydrogen has at least 90% purity.

Aspect 19. The method of any one of the preceding aspects, wherein the parahydrogen has a pressure of from about 50 psi (345 kPa) to about 500 psi (3447 kPa).

Aspect 20. The method of aspect 19, wherein the parahydrogen has a pressure of from about 75 psi (517 kPa) to about 200 psi (1379 kPa).

Aspect 21. The method of aspect 19, wherein the parahydrogen has a pressure of about 100 psi (690 kPa).

Aspect 22. The method of any one of the preceding aspects, wherein contacting the composition with parahydrogen is carried out for from about 1 s to about 150 s.

Aspect 23. The method of aspect 22, wherein contacting the composition with parahydrogen is carried out for from about 15 s to about 90 s.

Aspect 24. The method of any one of the preceding aspects, wherein contacting the composition with parahydrogen causes the transitioning from the first state to the second state.

Aspect 25. The method of any one of the preceding aspects, wherein contacting the composition with parahydrogen is carried out in a polarization transfer field of from about −30 μT to about 30 μT.

Aspect 26. The method of aspect 25, wherein contacting the composition with parahydrogen is carried out in a polarization transfer field of from about 0.3 to about 0.4 μT.

Aspect 27. The method of aspect 25, wherein contacting the composition with parahydrogen is carried out in a polarization transfer field of from about 0.1 mT to about 20 mT.

Aspect 28. The method of any one of the preceding aspects, wherein contacting the composition with parahydrogen comprises bubbling parahydrogen through the composition, delivering parahydrogen through a semipermeable membrane, or any combination thereof.

Aspect 29. The method of aspect 28, wherein the parahydrogen is bubbled at a rate of from about 30 sccm to about 4000 sccm.

Aspect 30. The method of aspect 29, wherein the parahydrogen is bubbled at a rate of from about 60 to about 200 sccm.

Aspect 31. The method of any one of aspects 3-30, wherein the low temperature is imparted to the composition in a cooling apparatus.

Aspect 32. The method of aspect 31, wherein the composition is removed from the cooling apparatus prior to contacting the composition with parahydrogen.

Aspect 33. The method of aspect 31 or 32, wherein removing the composition from the cooling apparatus is accomplished by a mechanical means or is accomplished manually.

Aspect 34. The method of aspect 33, wherein the mechanical means comprises pneumatic shuttling.

Aspect 35. The method of aspect 33, wherein the mechanical means comprises microfluidic shuttling of the sample through tubing using pressure.

Aspect 36. The method of any one of the preceding aspects, wherein the composition further comprises a co-ligand.

Aspect 37. The method of aspect 36, wherein the co-ligand comprises DMSO, ammonia, benzylamine, water, or any combination thereof.

Aspect 38. The method of aspect 36 or 37, wherein the ratio of target molecule to co-ligand is about 5 to 3.3.

Aspect 39. The method of any one of the preceding aspects, wherein the polarization transfer catalyst comprises a metal center coordinated with an organic ligand.

Aspect 40. The method of aspect 39, wherein the metal center comprises iridium, rhodium, cobalt, or any combination thereof.

Aspect 41. The method of aspect 39 or 40, wherein the polarization transfer catalyst comprises an N-heterocyclic carbene-based iridium catalyst, Crabtree's catalyst, 11,3-bis (2,4,6-trimethylphenyl) imidazole-2-ylidene (IMes), a derivative thereof, or any combination thereof.

Aspect 42. The method of any one of the preceding aspects, wherein the composition comprises from about 5 to about 100 mM target molecule, about 1-20 mM of the polarization transfer catalyst, and, if present, about 5-600 mM of the co-ligand.

Aspect 43. The method of aspect 42, wherein the composition comprises from about 30 to about 75 mM target molecule, about 6 mM polarization transfer catalyst, and, if present, about 20 mM DMSO co-ligand.

Aspect 44. The method of aspect 43, further comprising from about 150 to about 575 mm water co-ligand.

Aspect 45. The method of aspect 42, wherein the composition comprises from about 30 to about 60 mM target molecule.

Aspect 46. The method of any one of the preceding aspects, wherein the target molecule comprises at least one isotopic label.

Aspect 47. The method of aspect 46, wherein the at least one isotopic label comprises $^{13}C$, $^{15}N$, $^{19}F$, $^{1}H$, $^{31}P$, or any combination thereof.

Aspect 48. The method of any one of the preceding aspects, wherein the composition further comprises a solvent.

Aspect 49. The method of aspect 48, wherein the solvent is a deuterated solvent, a protonated solvent, or any combination thereof.

Aspect 50. The method of aspect 48 or 49, wherein the solvent comprises water, methanol, ethanol, chloroform, acetic acid, acetone, acetonitrile, benzene, methylene chloride, pyridine, or any combination thereof.

Aspect 51. The method of any one of the preceding aspects, wherein the target molecule is present in a total amount consisting of a first proportion and a second proportion, wherein the first proportion of the target molecule is free in solution, wherein the second proportion of the target molecule is bound to the polarization transfer catalyst.

Aspect 52. The method of aspect 51, wherein individual molecules can transfer from the first proportion to the second proportion or from the second proportion to the first proportion, and wherein the first proportion and the second proportion can vary.

Aspect 53. The method of aspect 51 or 52, wherein the method results in a hyperpolarization percentage of greater than about 1% for the total amount of the target molecule.

Aspect 54. The method of aspect 53, wherein the method results in a hyperpolarization percentage of greater than about 11% for the total amount of the target molecule.

Aspect 55. The method of aspect 53 or 54, wherein the method results in a hyperpolarization percentage of greater than about 10% for the first proportion of the target molecule.

Aspect 56. The method of any one of aspects 53-55, wherein the method results in a hyperpolarization percentage of greater than about 14% for the second proportion of the target molecule.

Aspect 57. A hyperpolarized target molecule prepared according to the method of any one of the preceding aspects.

Aspect 58. A contrast agent comprising the hyperpolarized target molecule of aspect 56.

Aspect 59. The contrast agent of aspect 58, wherein the contrast agent can be prepared in under 30 minutes.

Aspect 60. The contrast agent of aspect 59, wherein the contrast agent can be prepared in under 10 minutes.

Aspect 61. A method for diagnosing a disease or monitoring progress of treatment of a disease in a subject, the method comprising:

(a) administering the hyperpolarized target molecule of aspect 56 or the contrast agent of any one of aspects 58-60 to the subject; and (b) performing imaging on the subject, wherein performing imaging enables visualization of the hyperpolarized target molecule in the subject.

Aspect 62. The method of aspect 61, wherein the subject is a mammal.

Aspect 63. The method of aspect 61, wherein the mammal is a human, mouse, rat, pig, hamster, guinea pig, sheep, dog, cat, or horse.

Aspect 64. The method of any one of aspects 61-63, further comprising performing at least one processing or purification step on the hyperpolarized target molecule prior to administering the hyperpolarized target molecule to the subject.

Aspect 65. The method of aspect 64, wherein the at least one processing or purification step comprises filtration, catalyst removal, solvent exchange, pH adjustment, temperature adjustment, or any combination thereof.

Aspect 66. The method of any one of aspects 61-65, wherein the hyperpolarized target molecule is administered to the subject in a single injection.

Aspect 67. The method of any one of aspects 61-65, wherein the hyperpolarized target molecule is administered to the subject continuously for a period of from about 30 seconds to about 30 minutes.

Aspect 68. The method of any one of aspects 61-67, wherein the disease comprises cancer, cardiovascular disease, or a metabolic disorder.

Aspect 69. The method of aspect 68, wherein the cancer comprises prostate cancer, breast cancer, or brain cancer.

Aspect 70. The method of aspect 68, wherein the metabolic disorder comprises diabetes, pyruvate dehydrogenase complex deficiency, or pyruvate carboxylase deficiency.

Aspect 71. The method of any one of aspects 61-70, wherein the imaging is magnetic resonance imaging (MRI).

Aspect 72. The method of aspect 71, wherein magnetic resonance imaging is carried out using a cryogen-cooled superconducting magnet.

Aspect 73. The method of aspect 71, wherein magnetic resonance imaging is carried out using a cryogen-free magnet.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1: Pyruvate Hyperpolarization

Figure 1:
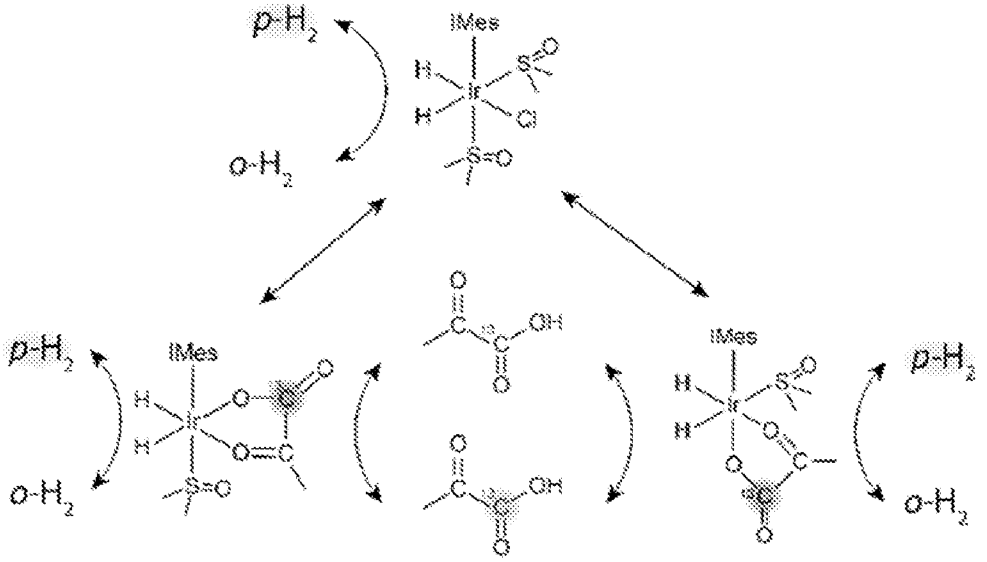
FIG. 1 shows a hyperpolarization scheme of [1-$^{13}$C] pyruvate, with a gradient representation of temperature cycling. The full IMes ligand is omitted for diagram clarity, where X=IMes (1,3-bis(2,4,6-trimethylphenyl)imidazole-2-ylidene).

A new maximum polarization of 10.8% on free pyruvate in solution was achieved with the SABRE method, shown in FIG. 2A. However, a level of 14.3% polarization on the bound pyruvate species was also reached, resulting in a total polarization of pyruvate in the sample of 11.8%. The spectrum and results shown in this figure are the maximum single-shot polarization achieved with any single sample used during this study. Full details of these polarization calculations are given below. To reach these new polarization levels [1-$^{13}$C]pyruvate is cooled to slow exchange (shown in FIG. 1). Additionally, a high ratio of catalyst to substrate (5 eqv [1-$^{13}$C]pyruvate, 3.3 eqv DMSO) is employed.

Figure 2C:
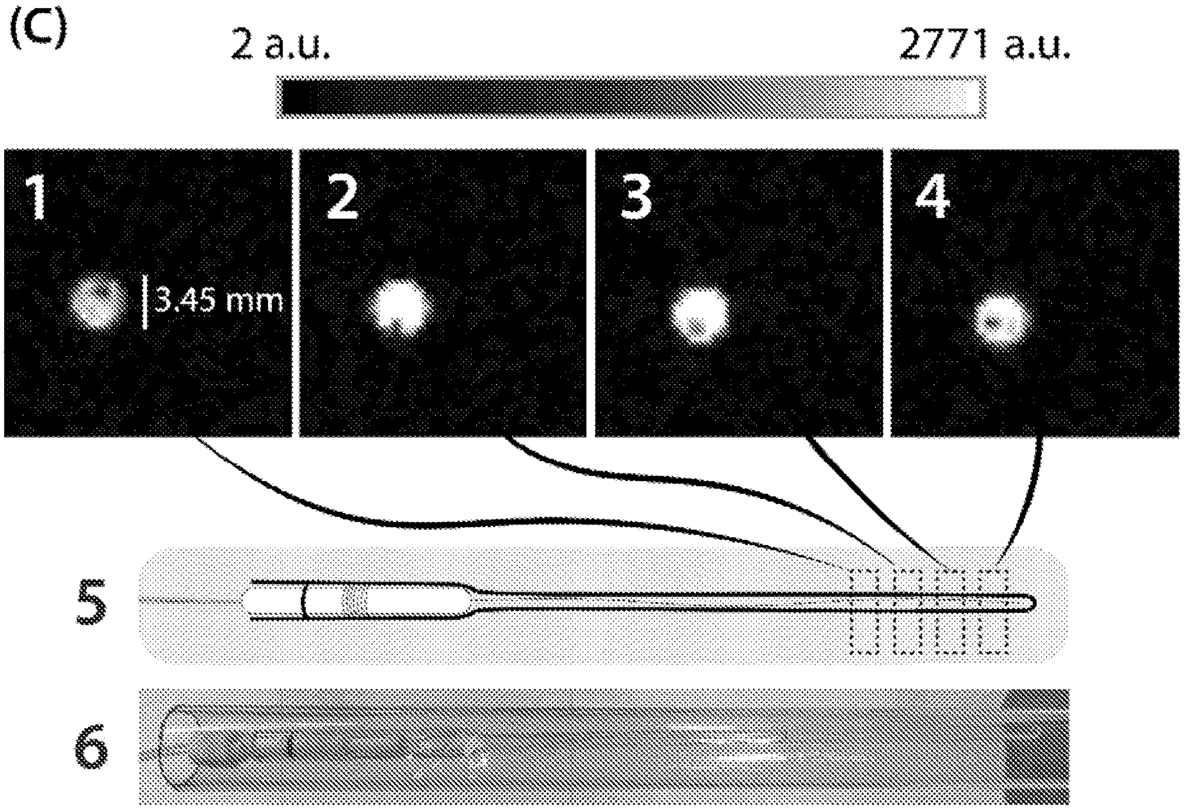
FIG. 2C shows magnetic resonance imaging of a hyperpolarized [1-$^{13}$C] pyruvate sample. Five slices of the image are taken in 1-5, with the NMR tube phantom shown in 6. The images are acquired with a fast spin echo sequence at 1.0 T with 32×32 voxels, 20 mm×20 mm FOV, an echo train length of 16 lines, and an overall scan time of 3.3 s. Full details regarding the setup and sequence are provided in the Examples.

Using the high polarization achieved on [1-$^{13}$C]pyruvate, a $^{13}$C image was acquired using a fast spin echo sequence in a 1.0 T cryogen-free magnet of the sample directly in a NMR tube with high resolution (FIG. 2C). As shown in these images, the hyperpolarized signal enables 3D multi-slice imaging of the 3.47 mm cross-sectional area of the NMR tube. The images are not optimized due to the rough positioning of the NMR tube in the coil volume giving variable shims. Remarkably, these rough images give enough resolution to elucidate what could be the NMR tube and capillary structure, highlighted in FIG. 2C, slice 2.

The temperature control and variance over the SABRE system before and during p-$H_2$ bubbling is crucial to maximize the observed polarization levels. Exchange is slowed with a low initial temperature but then increases as the sample is bubbled in a different temperature regime at the SABRE polarization transfer field (PTF). This enables slower initial exchange of the SABRE system, allowing for efficient polarization buildup on the bound pyruvate species. The heating of the sample then allows for the hyperpolarized pyruvate to exchange off the catalyst while simultaneously enabling SABRE to continue occurring through faster exchange events as the sample warms. In contrast to previous work, the present data suggests that at low temperatures hydrogen exchange still occurs on the 3b and 3a catalytic species with bound pyruvate.

Figures 3A, 3B, 3C, 3D:
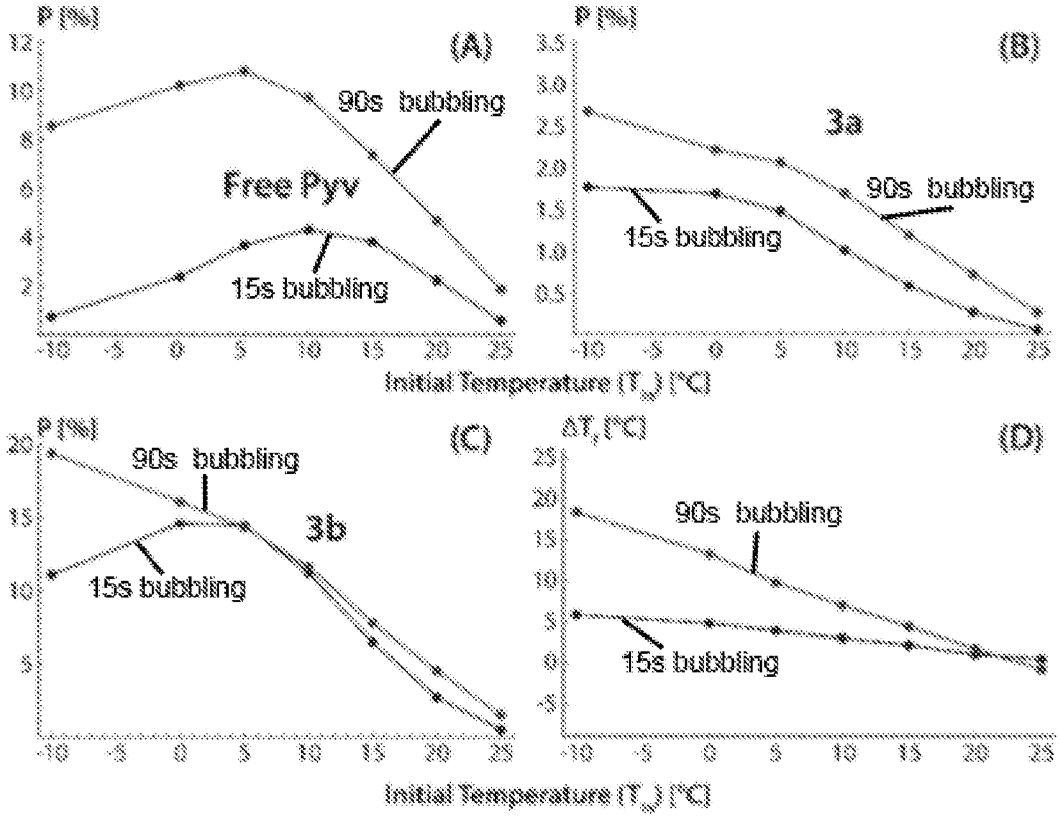
FIGS. 3A-3F show variable temperature dependence of (FIG. 3A) free and (FIGS. 3B-3C) bound pyruvate hyperpolarization.
Figures 3E, 3F:
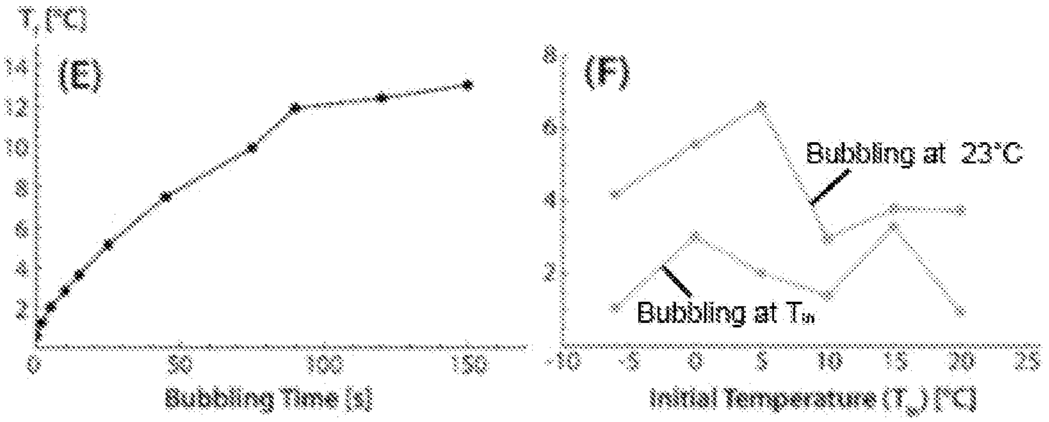

The results in FIGS. 3A-3F support the discussion above and highlight the dynamics of the pyruvate SABRE system in a low temperature regime. This discussion is assisted by an explanation of how temperature cycling is related to bubbling time for these experiments. A pneumatic shuttling system was used where the sample was initially cooled in the magnet probe with a Bruker variable temperature unit and then subsequently shuttled out of the cooled atmosphere into magnetic shields at approximately room temperature for SABRE-SHEATH (SHield Enables Alignment Transfer to Heteronuclei) matching conditions. At a low bubbling time (15 s), there is a small deviation in the sample temperature of less than 5° C. from the initial set temperature. However, at a longer bubbling time (90 s) the sample can experience up to a 17° C. deviation in temperature. For example, at an initial temperature of −10° C. the sample warms to 7° C. after 90 s bubbling and for an initial temperature of 5° C. the sample warms to 14° C. after 90 s bubbling. FIG. 3E shows an example temperature gradient the sample experiences with shuttling for variable bubbling times, starting at an initial temperature of 0° C. The full details of these calibrations are explained in Example 4.

The polarization of the bound pyruvate species 3b (FIG. 3B) and 3a (FIG. 3C) suggest that at lower temperatures faster exchange of the hydrides is induced during temperature cycling before faster pyruvate exchange, leading to higher buildup of polarization on the pyruvate in the bound configuration. As the sample warms during bubbling, the pyruvate exchange rate increases allowing highly polarized bound pyruvate to exchange into solution. This is observed in the high polarization levels of bound pyruvate at low initial temperatures for 90 s bubbling, while the polarization of free pyruvate at lower initial temperatures tails off from the maximum. At the 5° C. initial temperature (gradient of 5° C. to 14° ° C. at 90 s bubbling), there is an optimum exchange of pyruvate while still maximizing the bound species polarization, giving the maximum free pyruvate polarization (FIG. 3A).

This temperature gradient or cycling to modulate chemical exchange allows achievement of the new maximum polarization levels achieved with [1-$^{13}$C]pyruvate. Using manual sample transfer at 1.1 T, it is shown herein that this field cycling method is favorable relative to constant temperature experiments (FIG. 3F). The lower relative polarization values in this data to the data acquired with shuttling are due to inconsistencies and lack of reproducibility in manually moving the sample. Additionally, the temperature gradients in these experiments are different than the shuttling experiments, as these experiments use water cooling to modulate the sample temperature while the shuttling experiments use air cooling through the Bruker VTU interface. This difference in sample cooling dynamics gives different thermal contact between the heat bath and the sample, resulting in variable temperature gradients between the two methods.

Figure 4A:
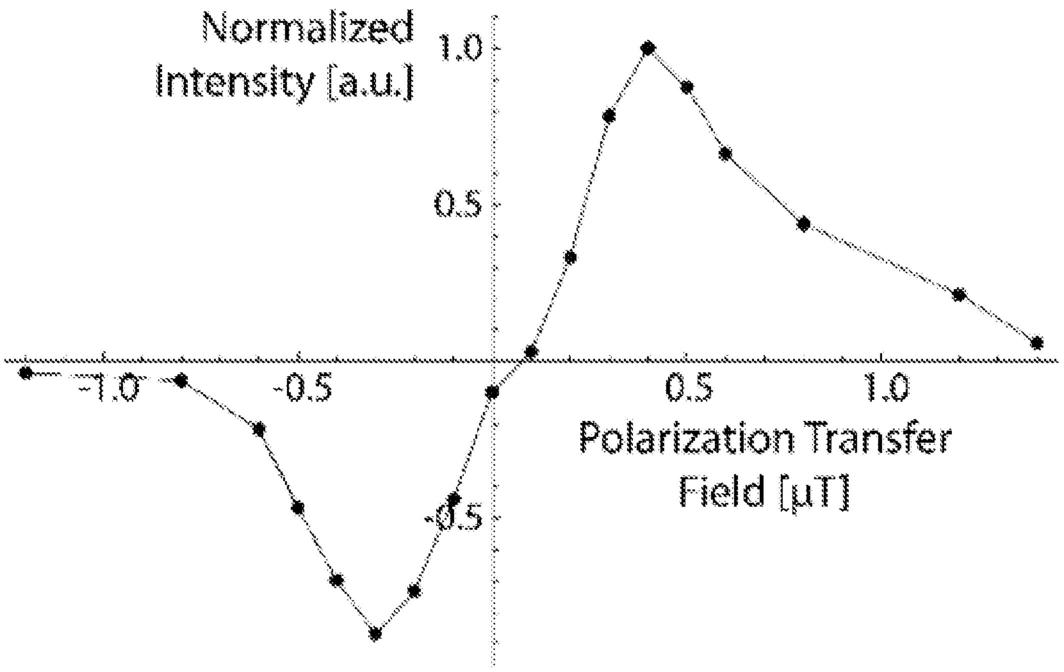
FIG. 4A shows measurement of the polarization transfer field.
Figure 4B:
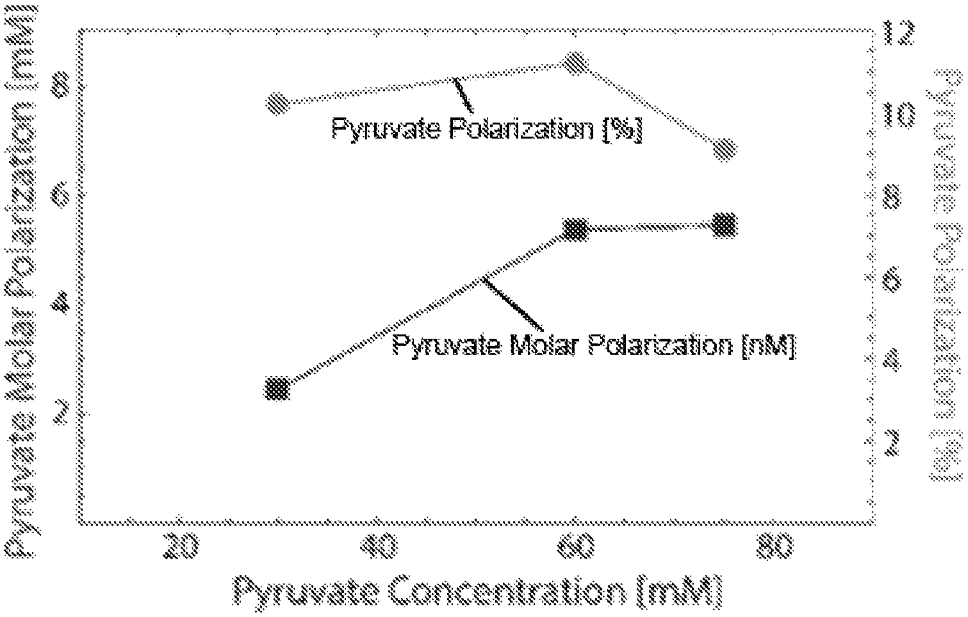
FIG. 4B shows sample concentration polarization dependence.
Figure 4C:
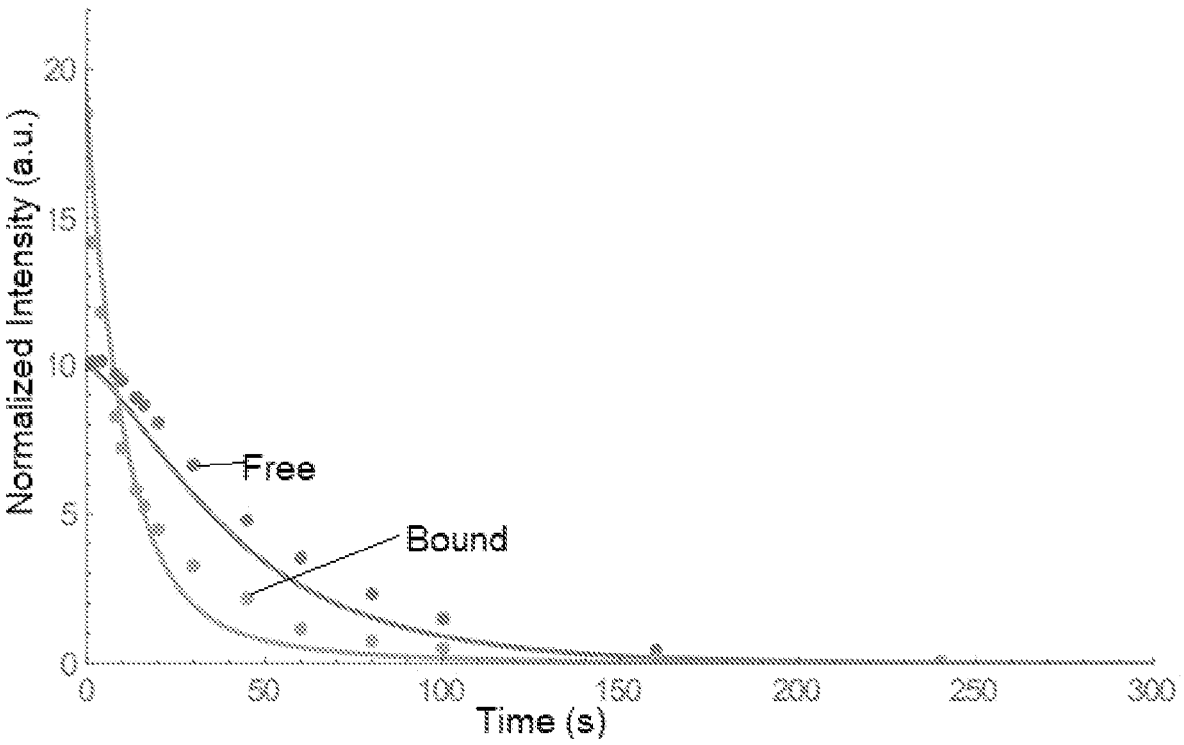
FIG. 4C shows 9.4 T $T_1$ relaxation.
Figure 4D:
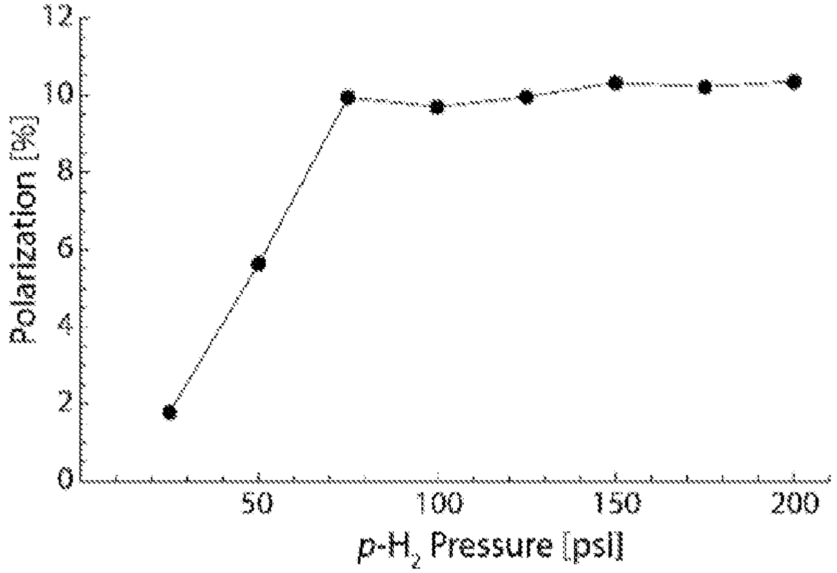
FIG. 4D shows p-$H_2$ pressure.
Figure 4E:
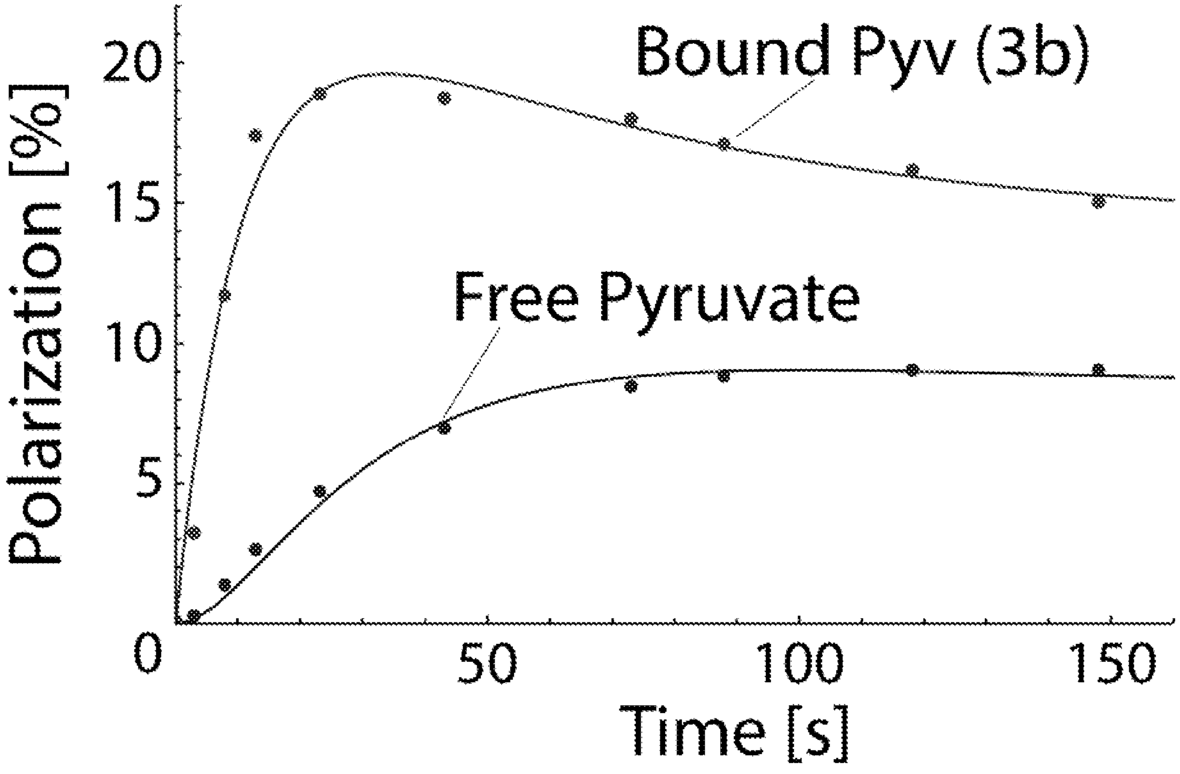
FIG. 4E shows polarization buildup. Catalyst and DMSO concentrations are scaled with the pyruvate concentration in FIG. 4B to maintain the same ratios. Unless varied, all data is acquired at 0° ° C. with a 0.3 μT PTF and 100 psi p-$H_2$ at 75 sccm.

Parameter optimization and measurement are shown in FIGS. 4A-4E and 8. A standard PTF dependence is observed for SABRE-SHEATH, with typical maxima observed at ~0.3 to 0.4 UT (FIG. 4A). Additionally, the measured impact of p-$H_2$ pressure on the pyruvate polarization demonstrates that p-$H_2$ is not the limiting substrate in this reaction (FIG. 4D). The measured polarization buildup (FIG. 4E) relative to the 0.3 μT relaxation (FIG. 8) for this system is shown to be fast for the bound species, as p-$H_2$ exchange is emphasized at initial low temperatures with shorter bubbling times, while exchange of pyruvate on the SABRE catalyst only occurs as the sample warms to higher temperatures. This effect is also emphasized by the drop in polarization in the 3b bound pyruvate species at longer bubbling times as faster exchange is induced during sample warming.

The high-field (9.4 T) relaxation times in FIG. 4C also highlight this exchange effect. These experiments are conducted by first bubbling for 90 s at the PTF, raising the sample temperature to 12° C. Then the sample is shuttled back to the bore of the magnet, gradually cooling the sample back to the initial temperature of 0° C. The effect of pyruvate exchange is observed in the skewed fitting to a single exponential decay, as the decay rates of the free and bound pyruvate decrease with longer delay periods as exchange is reduced and the system undergoes less ex-change. An inverse effect can be observed in the measurement of LF (0.3 μT) relaxation times as shown below, as the variable delay occurs in the higher temperature regime.

Figure 10:
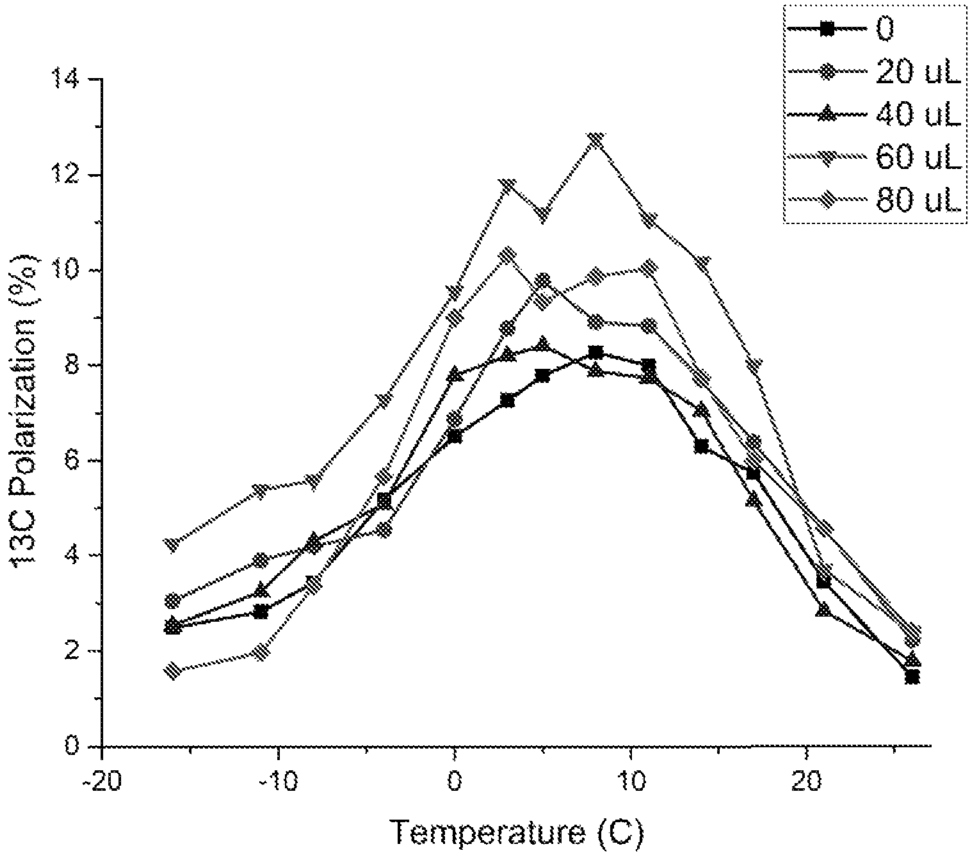
FIG. 10 shows the effect of different concentrations of water co-ligands on $^{13}$C polarization.
Figure 11A:
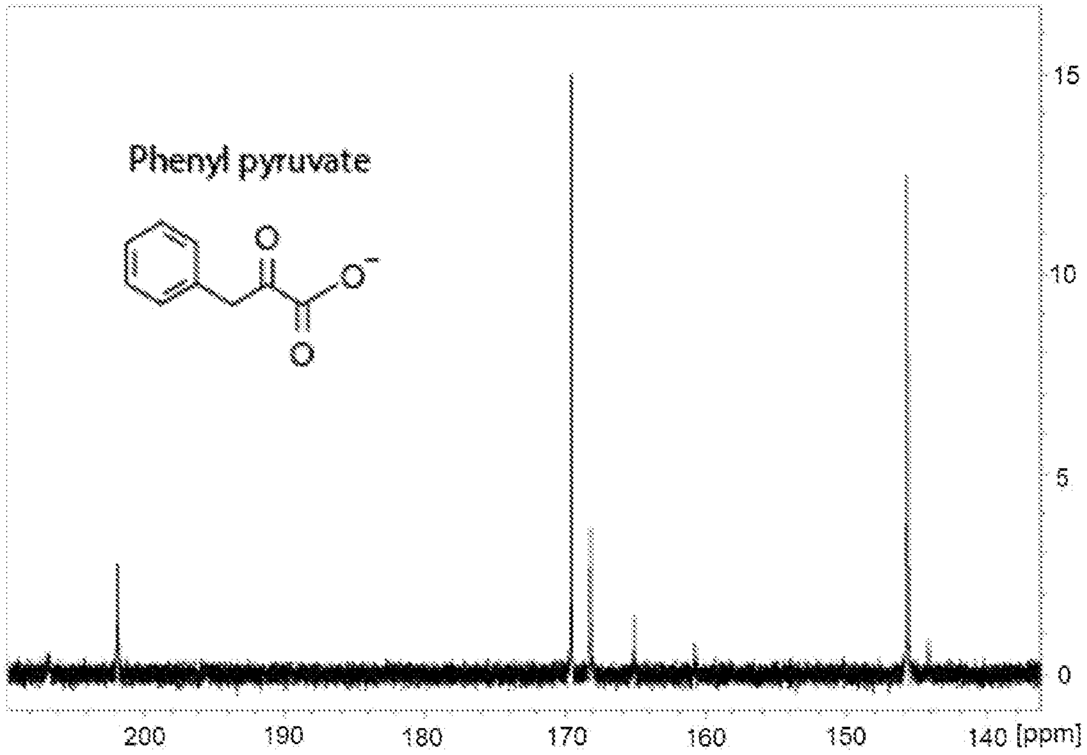
FIGS. 11A-11D show hyperpolarized spectra of phenyl pyruvate (FIG. 11A), alpha-keto glutarate (FIG. 11B), phenyl glyoxylate (FIG. 11C), and oxaloacetate (FIG. 11D) as additional examples of the scope of the chemical method described in this document. Single scan hyperpolarized spectra are acquired using an initial substrate concentration of 30 mM mixed with 6 mM catalyst and 24 mM DMSO in methanol. All spectra are acquired with 90 s parahydrogen bubbling at 0.3 μT, 0-5° C. and acquired at 400 MHz.
Figure 11B:
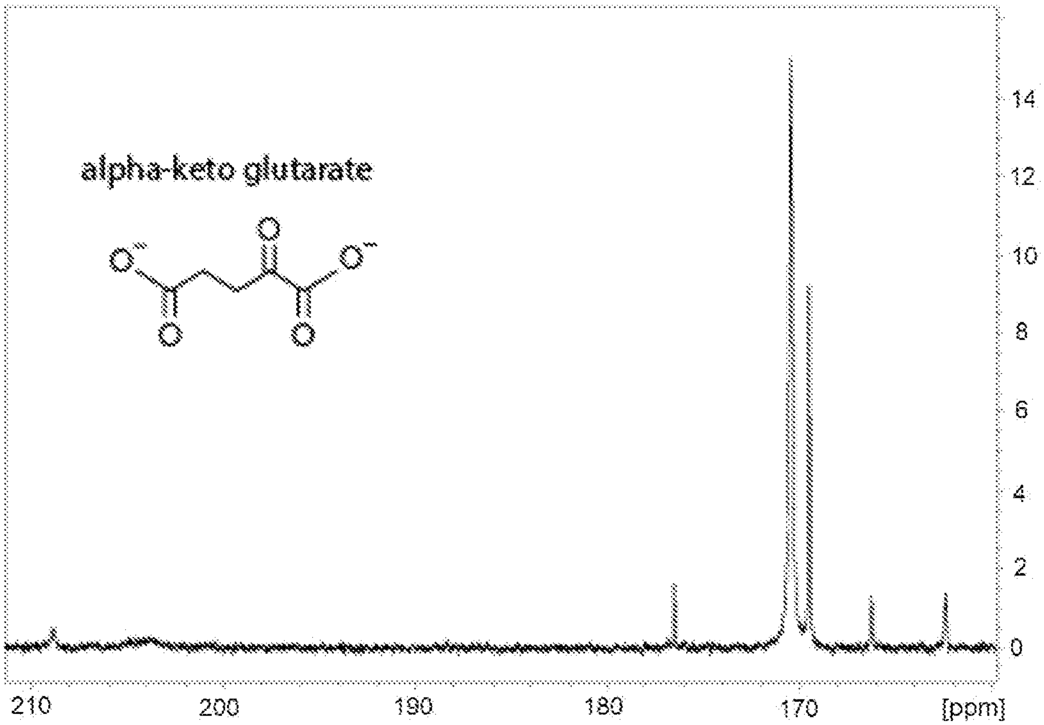
Figure 11C:
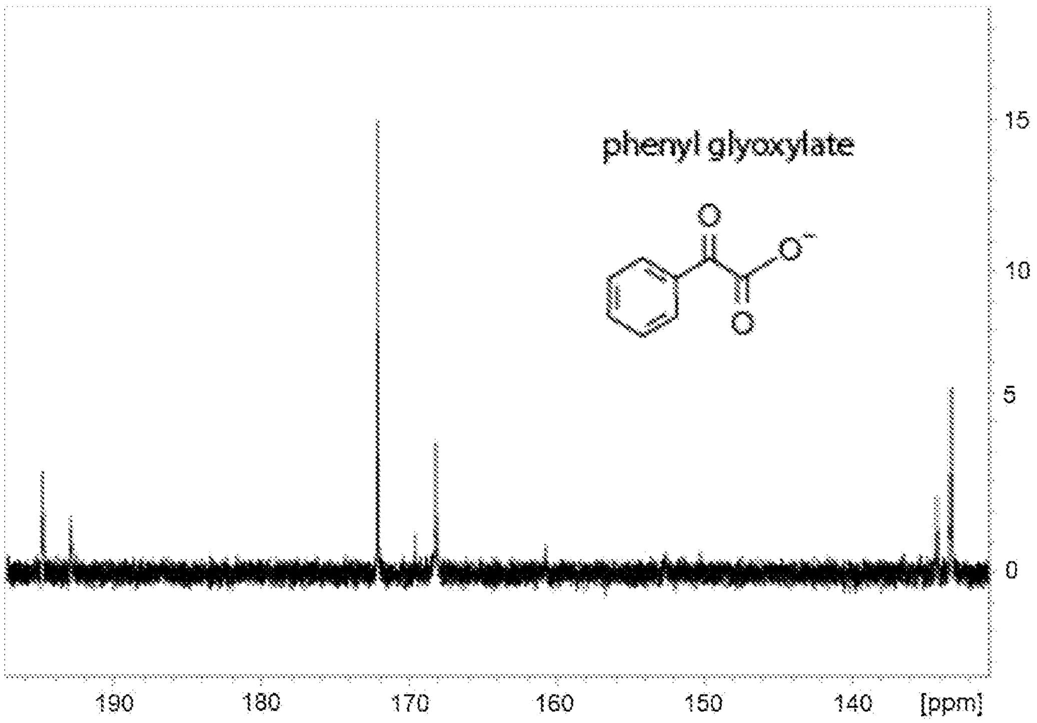
Figure 11D:
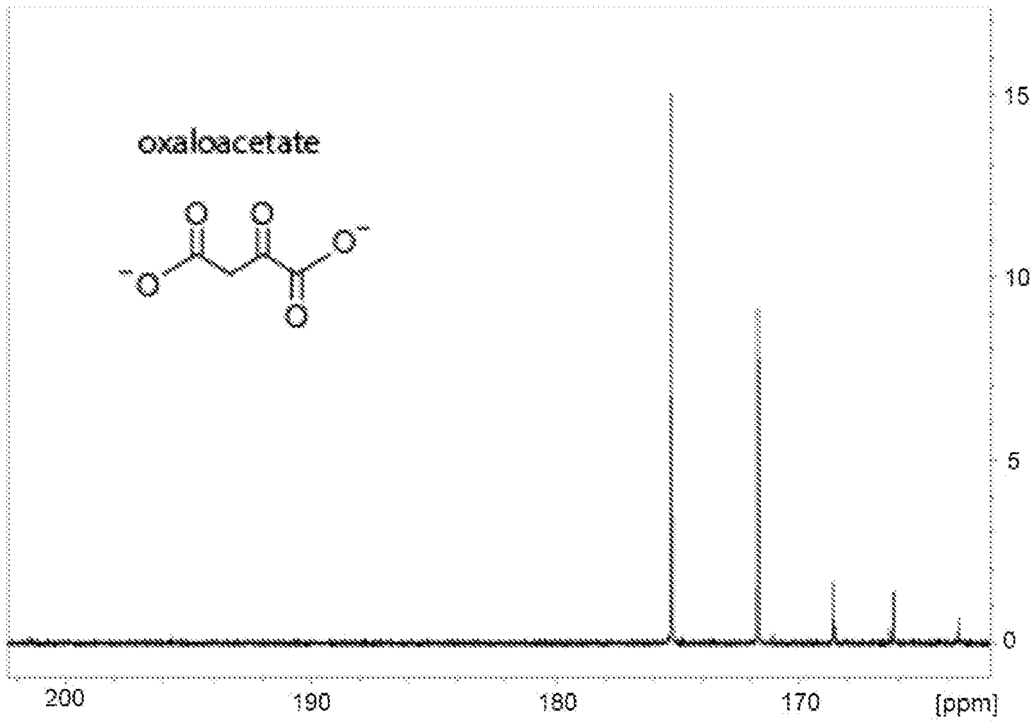

One significant result of these optimization studies is the scalability of $^{13}C$ pyruvate polarization from 30 mM [1-$^{13}C$] pyruvate (where all the previously discussed results were obtained) to 60 mM [1-$^{13}C$]pyruvate (maintaining the same ratios of catalyst and DMSO). This leads to an effective doubling of the molar polarization metric introduced by Knecht et al. Shifting to an even higher concentration near the maximum solubility of sodium pyruvate in methanol (75 mM) yields a lower polarization, demonstrating an ideal sample composition of 60 mM pyruvate for future studies and in vivo investigations. In some experiments, a water co-ligand was also included (see FIG. 10).

These results demonstrate a new threshold for not only pyruvate SABRE hyperpolarization, but the general SABRE method. The new maximum polarization values of 11.8% total polarization for [1-$^{13}C$]pyruvate and 10.8% free polarization lay the groundwork for further optimization and demonstrate increased feasibility of future in vivo translation of the SABRE hyperpolarization method. Specifically, the facile and robust nature of SABRE hyperpolarization relative to other hyperpolarization methods makes it an easily scalable technology. In these results the important roles the choice of spin system, temperature, and sample composition play in achieving high polarization levels with SABRE are emphasized.

Example 2: Standard Sample Composition and Reagents

All experiments use 93% parahydrogen gas produced with a commercially available ARS parahydrogen generator. All NMR experiments were run on a Bruker Ascend 400 MHz with Neo Avance console unless otherwise specified. The polarization transfer field was controlled through degaussing of magnetic shielding (Magnetic Shield Corp) using a Twinleaf DG-10 degaussing unit. The magnetic field was controlled using a hand-wrapped solenoid.

Figure 5:
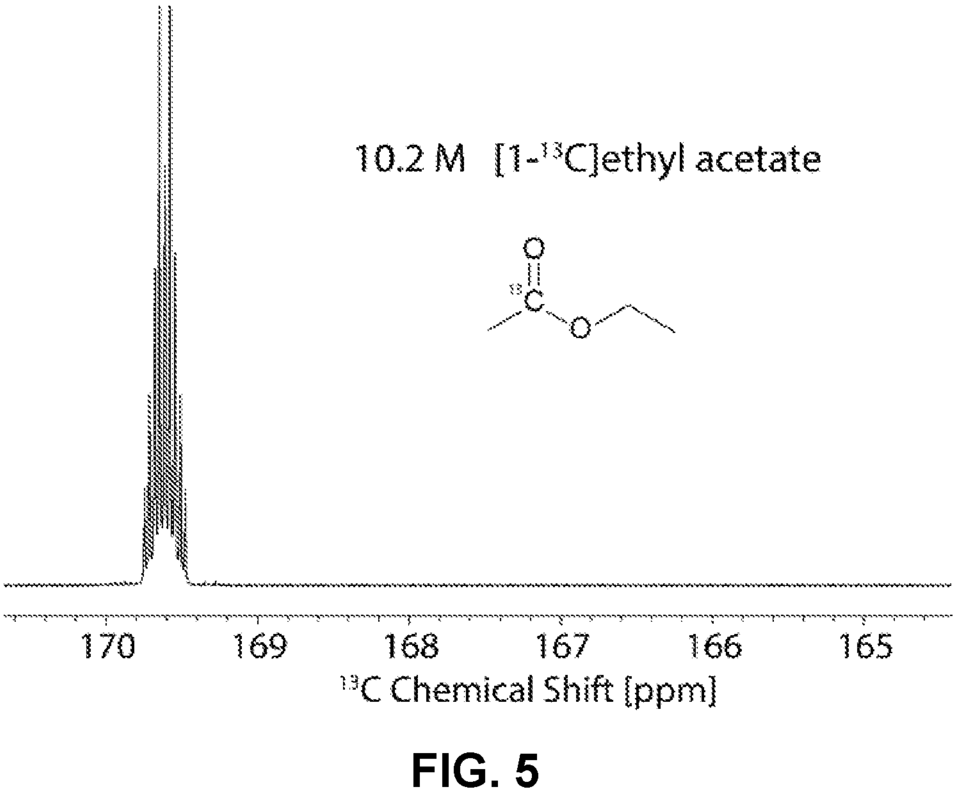
FIG. 5 shows a $^{13}$C NMR spectrum of [1-$^{13}$C]ethyl acetate thermalized at 9.4 T.

Example 3: Polarization Calculations $^{13}C$ polarization is calculated with a thermal reference spectrum of a pure compound. In this work, [1-$^{13}C$]ethyl acetate (10.2 M) thermalized at 9.4 T was used. This spectrum is shown in FIG. 5.

Polarization is calculated by the following equation, $$P = \tanh\left(\frac{\hbar\gamma B_0}{2k_bT}\right)\times\frac{S_{HP}}{S_{REF}}\times\frac{Conc_{REF}}{Conc_{HP}}\times\frac{A_{HP}}{A_{REF}} \quad \text{(Eq 1)}$$

The initial tan h term computes the thermal polarization of the respective nucleus at a given temperature and magnetic field. $S_{HP}$ and $S_{REF}$ are the signal from the hyperpolarized and reference spectra, respectively. $A_{HP}$ and $A_{REF}$ are the cross-sectional area of the hyperpolarized and reference samples, respectively. The difference in the cross-sectional area arises from the presence of the capillary in the NMR tube for bubbling parahydrogen. The capillary used has an outer diameter of 0.79375 mm and an inner diameter of 0.33867 mm. Due to the pressure differences in the bubbling scheme, the sample travels a short distance up the capillary after bubbling is stopped, filling the interior of the capillary with hyperpolarized solution. Therefore, only the wall thickness of the capillary was subtracted from the cross-sectional area of the NMR tube. For a Wilmad 524-PV-7 high-pressure NMR tube with inner diameter 3.46 mm, the ratio of the cross-sectional areas ($A_{HP}/A_{REF}$) is given by the following, $$\frac{A_{HP}}{A_{REF}} = \frac{\pi r_{HP}^2}{\pi r_{REF}^2} = \frac{(NMR_{ID}/2)^2}{((NMR_{ID}-(Cap_{OD}-Cap_{ID}))/2)^2} = 1.326 \quad \text{(Eq 2)}$$

This is then scaled by the ratio of the concentration of the hyperpolarized pyruvate sample and the concentration of the reference sample. For this work, it is assumed that one equivalent of pyruvate is bound to the catalyst. For example, for a 30 mM pyruvate sample with 6 mM catalyst, a concentration of 0.024 M free pyruvate was used to calculate the polarization. Likewise, it was assumed for the bound forms of pyruvate there is one equivalent bound to the catalyst, using 0.006 M as the concentration of bound pyruvate in the polarization calculations. These concentrations are more likely lower than the values assumed, but these assumptions allow for a simplification of the picture of pyruvate polarization without artificially inflating the polarization values.

Example 4: Temperature Calibration

Figure 6:
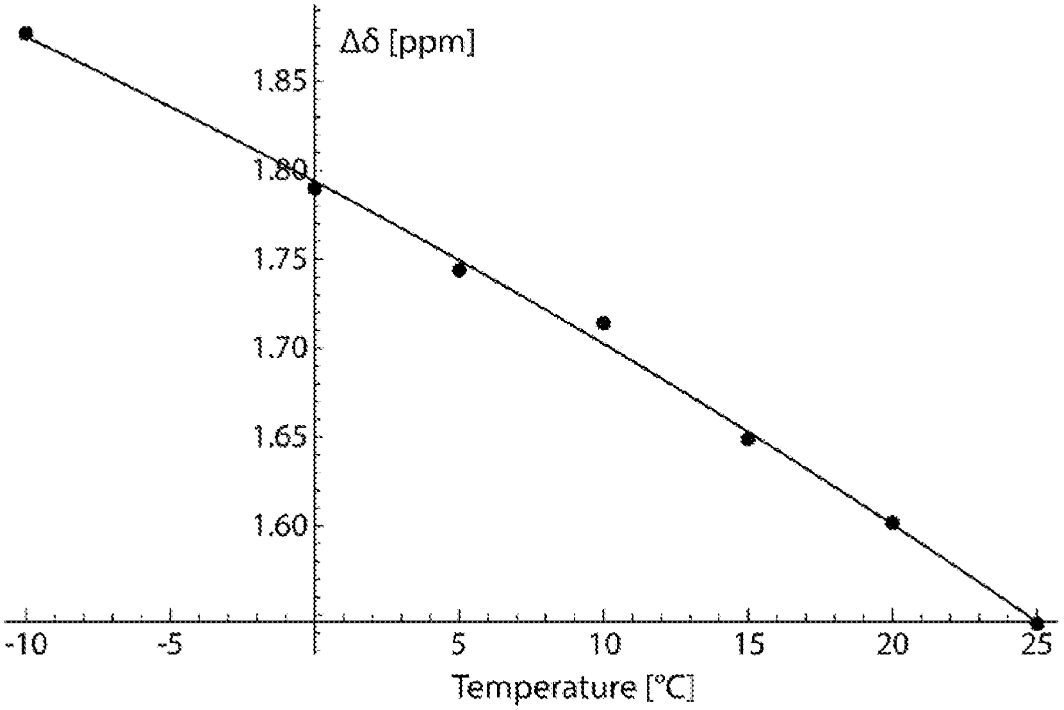
FIG. 6 shows calibration of a methanol thermometer at 400 MHZ.

The temperature drift during bubbling in the presented pyruvate SABRE experiments was calculated using calibration with proton experiments to measure and fit the change of the OH to $CH_3$ chemical shift in methanol, traditionally described as the "NMR methanol thermometer". The calibration of the methanol thermometer at 400 MHz is shown in FIG. 6, sampling the same temperature range over which the temperature cycling of the pyruvate samples was studied.

The change in the chemical shift difference of the OH and $CH_3$ methanol peaks (48) is fit to a quadratic function, yielding the following equation for the temperature, $$T = 1.7939 - 0.0086258\Delta\delta - 0.0000512515\Delta\delta^2$$

This equation is then used to calculate the temperatures for the sample temperature after bubbling for different times at various initial temperatures. Analogous data sets for $^1H$ and $^{13}C$ were acquired for all initial temperatures and bubbling times, allowing us to calculate the final observed temperature for each condition. The list of these final observed temperatures for each condition are given in Table 1.

TABLE 1

Temperature Change with Varied Bubbling and Initial Temperatures

| Initial Temperature (° C.) | Bubbling Time (s) | Chemical Shift Difference, Δδ (ppm) | Final Observed Temperature (° C.) |
|---|---|---|---|
| −10 | 15 | 1.835 | −4.9 |
| 0 | 15 | 1.758 | 4.1 |
| 5 | 15 | 1.720 | 8.2 |
| 10 | 15 | 1.681 | 12.2 |
| 15 | 15 | 1.639 | 16.4 |
| 20 | 15 | 1.598 | 20.3 |
| 25 | 15 | 1.550 | 24.7 |
| −10 | 90 | 1.725 | 7.6 |
| 0 | 90 | 1.678 | 12.5 |
| 5 | 90 | 1.663 | 14.0 |
| 10 | 90 | 1.640 | 16.3 |
| 15 | 90 | 1.615 | 18.7 |
| 20 | 90 | 1.591 | 20.9 |
| 25 | 90 | 1.564 | 23.4 |
| 0 | 2 | 1.783 | 1.3 |
| 0 | 5 | 1.776 | 2.0 |
| 0 | 10 | 1.769 | 2.8 |
| 0 | 15 | 1.762 | 3.6 |
| 0 | 25 | 1.748 | 5.1 |
| 0 | 45 | 1.726 | 7.5 |
| 0 | 75 | 1.703 | 9.9 |
| 0 | 90 | 1.684 | 11.9 |
| 0 | 120 | 1.679 | 12.4 |
| 0 | 150 | 1.672 | 13.1 |

Example 5: Parahydrogen Flow Rate Comparison

Figure 7:
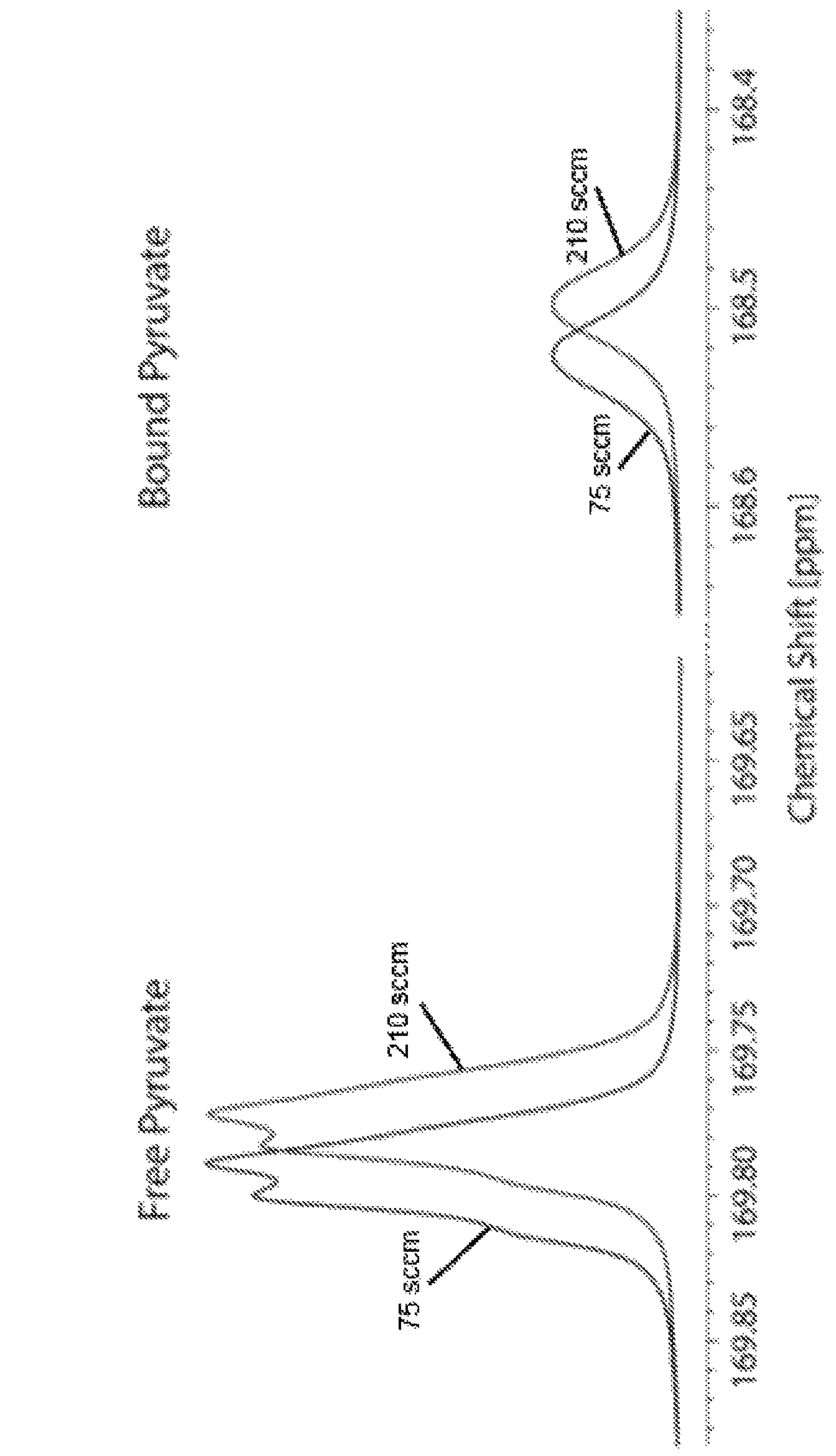
FIG. 7 shows flow rate comparison at 200 psi parahydrogen. Spectra are offset for easier visual comparison.

Previous SABRE studies have demonstrated an impact of parahydrogen flow rate on hyperpolarization, specifically at higher pressures due to the compression of the bubble size. However, it was observed that there is little dependence on the parahydrogen flow rate on polarization at high pressure (FIG. 7).

Example 6: Low-Field $T_1$ Measurement

Figure 8:
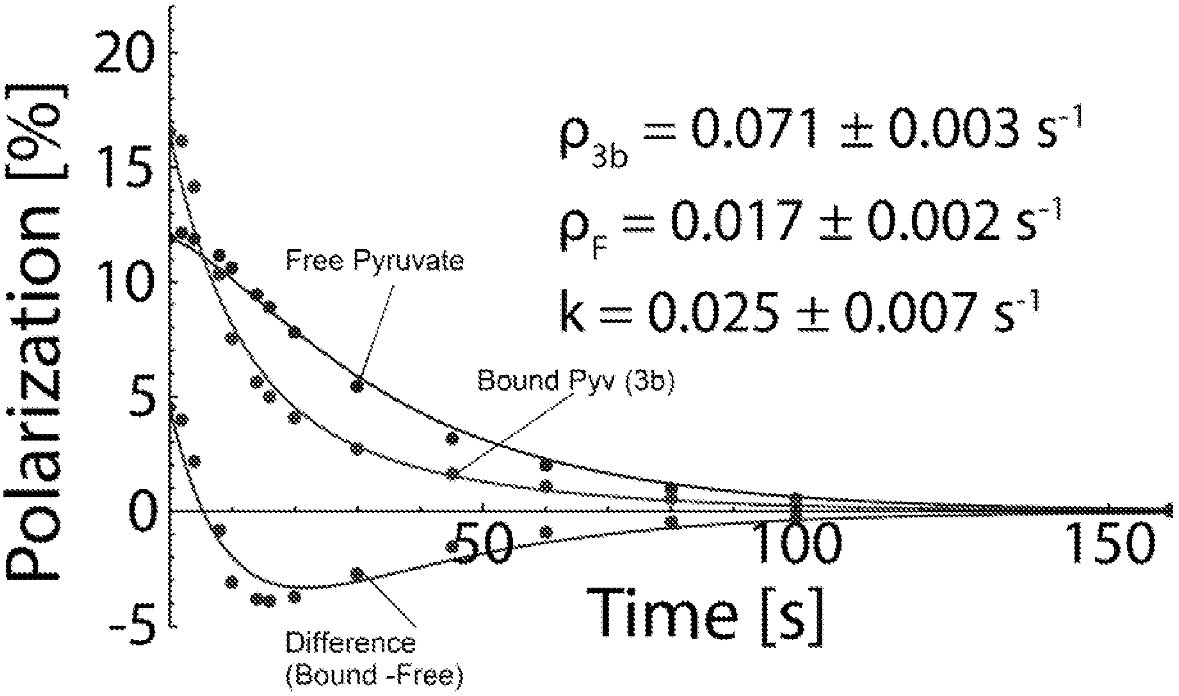
FIG. 8 shows low-field (0.3 T) $T_1$ relaxation measurement for hyperpolarized pyruvate. All data was acquired at an initial temperature of 0° C. with 90 s of parahydrogen bubbling at 100 psi, 75 sccm.

FIG. 8 shows the measured $T_1$ relaxation data for hyperpolarized [1-$^{13}C$]pyruvate. This data is acquired by first hyperpolarizing the sample at 0.3 μT and then waiting at that field for a variable delay before shuttling for detection (low-field, LF, relaxation).

Note in the relaxation measurements the non-exponential fitting of the relaxation data—this is due to the continued exchange or buildup of polarization on the bound and free pyruvate species, resulting in skewing of the relaxation results.

Example 7: Pyruvate Isotopomer Variation

A study of the different isotopomers of pyruvate reveals that this observed temperature cycling optimization is unique to the hyperpolarization of the [1-$^{13}C$]pyruvate isotopomer. The same SABRE conditions were applied to the other two pyruvate isotopomers, [2-$^{13}C$]pyruvate and [$^{13}C_2$] pyruvate. These results are shown in Table 2, where the average polarization values are shown for multiple SABRE experiments.

TABLE 2

Pyruvate Isotopomer Hyperpolarization at 6° C., 0.3 μT

1a

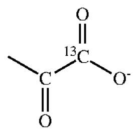

1b

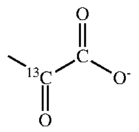

1c

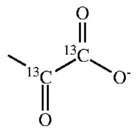

| Isotopomer | 1-$^{13}C$ | 2-$^{13}C$ |
|---|---|---|
| 1a | 4.6 ± 0.2% | NA |
| 1b | NA | 1.1 ± 0.4% |
| 1c | 0.3 ± 0.1% | 0.5 ± 0.1% |

Figure 9:
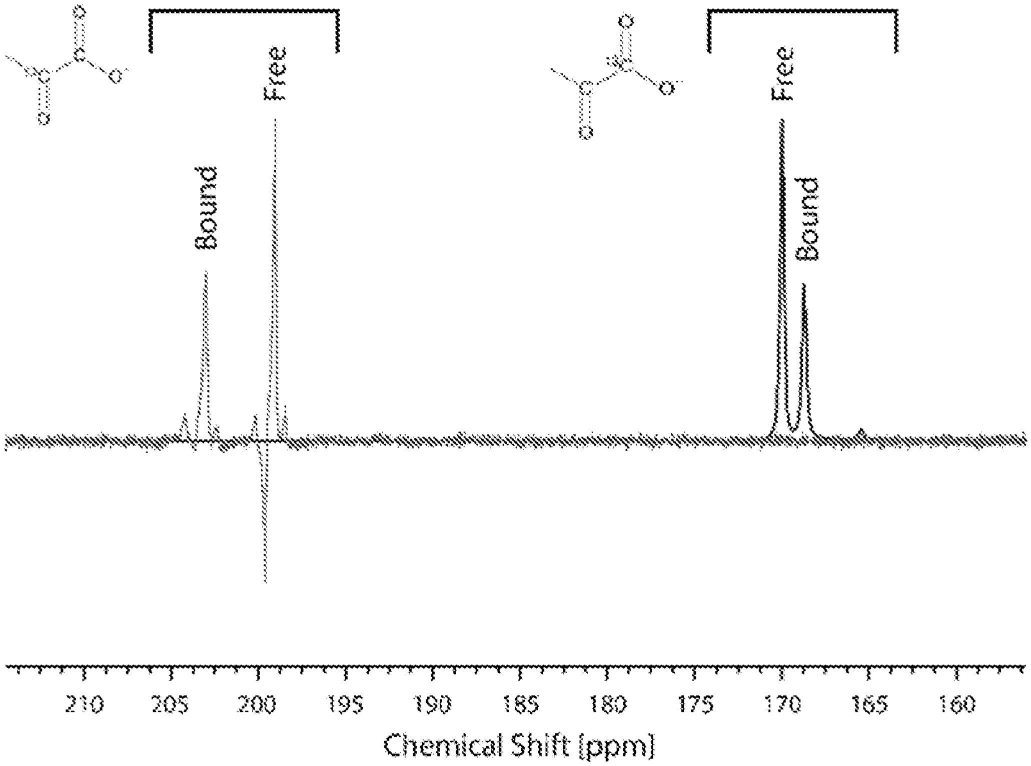
FIG. 9 shows a comparison of the hyperpolarized spectra of [1-$^{13}$C]pyruvate and [2-$^{13}$C]pyruvate. The spectra are scaled for easier comparison of the peak structures.

The data for this isotopomer study was acquired using manual sample transfer and temperature cycling in a 1.1 T benchtop magnet (Magritek), lowering the efficiency of sample transfer and temperature cycling to yield the lower polarization values given. Regardless, the significantly lower relative polarization on the 2-$^{13}C$ and $^{13}C_2$ isotopomers is caused by the population of higher spin order states between the three protons in the methyl group and the 2-$^{13}C$ spin, which also acts as an additional source of relaxation during transfer from the sample from microtesla fields (0.3 μT) to 1.1 T for detection. This effect can be seen in an overlay of the hyperpolarized 1-$^{13}C$ and 2-$^{13}C$ spectra, normalized to allow for easier comparison between the peak shapes (FIG. 9). Specifically note the anti-phase peak shape of the free [2-$^{13}C$]pyruvate, which is also significantly affected by the speed at which the sample is transferred from the shields to the magnet for detection.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

REFERENCES

1. Adams, R. W.; et al. Reversible Interactions with Para-Hydrogen Enhance NMR Sensitivity by Polarization Transfer. Science (80-.). 2009, 323 (5922), 1708-1711.
2. Ardenkjaer-Larsen, J. H.; et al. Facing and Overcoming Sensitivity Challenges in Biomolecular NMR Spectroscopy. Angew. Chemie-Int. Ed. 2015, 54 (32), 9162-9185.
3. Ardenkjaer-Larsen, J. H.; et al. Increase in Signal-to-Noise Ratio of >10,000 Times in Liquid-State NMR. Proc. Natl. Acad. Sci. 2003, 100 (18), 10158-10163.
4. Barskiy, D. A.; et al. SABRE: Chemical Kinetics and Spin Dynamics of the Formation of Hyperpolarization. Prog. Nucl. Magn. Reson. Spectrosc. 2019, 114-115, 33-70.
5. Cavallari, E.; et al. 13C MR Hyperpolarization of Lactate by Using ParaHydrogen and Metabolic Transformation in Vitro. Chem.-A Eur. J. 2017, 23 (5), 1200-1204.
6. Cavallari, E.; et al. Studies to Enhance the Hyperpolarization Level in PHIP-SAH-Produced C13-Pyruvate. J. Magn. Reson. 2018, 289, 12-17.
7. Cavallari, E.; et al. The 13C Hyperpolarized Pyruvate Generated by ParaHydrogen Detects the Response of the Heart to Altered Metabolism in Real Time. Sci. Rep. 2018, 8 (1), 8366.
8. Colell, J. F. P.; et al. Generalizing, Extending, and Maximizing Nitrogen-15 Hyperpolarization Induced by Parahydrogen in Reversible Exchange. J. Phys. Chem. C 2017, 121 (12), 6626-6634.
9. Cowley, M. J.; et al. Iridium N-Heterocyclic Carbene Complexes as Efficient Catalysts for Magnetization Transfer from Para-Hydrogen. J. Am. Chem. Soc. 2011, 133 (16), 6134-6137.
10. Eills, J.; et al. Real-Time Nuclear Magnetic Resonance Detection of Fumarase Activity Using Parahydrogen-Hyperpolarized [1-13 C]Fumarate. J. Am. Chem. Soc. 2019, 141 (51), 20209-20214.
11. Fiordelisi, M. F.; et al. Magnetic Resonance Imaging for Translational Research in Oncology. J. Clin. Med. 2019, 8 (11), 1883.
12. Gallagher, F. A.; et al. Imaging Breast Cancer Using Hyperpolarized Carbon-13 MRI. Proc. Natl. Acad. Sci. U.S.A. 2020, 117 (4), 2092-2098.
13. Hermkens, N. K. J.; et al. High Field Hyperpolarization-EXSY Experiment for Fast Determination of Dissociation Rates in SABRE Complexes. J. Magn. Reson. 2017, 276 (2017), 122-127.
14. Hövener, J. B.; et al. A Continuous-Flow, High-Throughput, High-Pressure Parahydrogen Converter for Hyperpolarization in a Clinical Setting. NMR Biomed. 2013, 26 (2), 124-131.
15. Iali, W.; et al. Achieving High Levels of NMR-Hyperpolarization in Aqueous Media With Minimal Catalyst Contamination Using SABRE. Chem.-A Eur. J. 2017, 23 (44), 10491-10495.
16. Iali, W.; et al. Hyperpolarising Pyruvate through Signal Amplification by Reversible Exchange (SABRE). Angew. Chemie 2019, 131 (30), 10377-10381.
17. Kidd, B. E.; et al. Facile Removal of Homogeneous SABRE Catalysts for Purifying Hyperpolarized Metronidazole, a Potential Hypoxia Sensor. J. Phys. Chem. C 2018, 122 (29), 16848-16852.
18. Kiryutin, A. S.; et al. 15N SABRE Hyperpolarization of Metronidazole at Natural Isotope Abundance. ChemPhysChem 2021, 1-9.
19. Knecht, S.; et al. Rapid Hyperpolarization and Purification of the Metabolite Fumarate in Aqueous Solution. Proc. Natl. Acad. Sci. U.S.A. 2021, 118 (13), 1-6.
20. Kovtunov, K. V.; et al. Hyperpolarized NMR Spectroscopy: D-DNP, PHIP, and SABRE Techniques. Chem.-An Asian J. 2018, 13 (15), 1857-1871.
21. MacCulloch, K.; et al Hyperpolarization of Common Antifungal Agents with SABRE. Magn. Reson. Chem. 2021, No. June, 1-11.
22. Miloushev, V. Z.; et al. Metabolic Imaging of the Human Brain with Hyperpolarized 13C Pyruvate Demonstrates 13C Lactate Production in Brain Tumor Patients. Cancer Res. 2018, 78 (14), 3755-3760.
23. Nelson, S. J.; et al. Metabolic Imaging of Patients with Prostate Cancer Using Hyperpolarized [1-13C]Pyruvate. Sci. Transl. Med. 2013, 5 (198), 198ra108-198ra108.
24. Nikolaou, P.; et al. NMR Hyperpolarization Techniques for Biomedicine. Chem.-A Eur. J. 2015, 21 (8), 3156-3166.
25. Raiford, D. S.; et al. Calibration of Methanol and Ethylene Glycol Nuclear Magnetic Resonance Thermometers. Anal. Chem. 1979, 51 (12), 2050-2051.
26. Rayner, P. J.; et al. Fine-Tuning the Efficiency of Para-Hydrogen-Induced Hyperpolarization by Rational N-Heterocyclic Carbene Design. Nat. Commun. 2018, 9 (1), 4251.
27. Ripka, B.; et al. Hyperpolarized Fumarate via Parahydrogen. Chem. Commun. 2018, 54 (86), 12246-12249.
28. Serrao, E. M.; et al. Potential Clinical Roles for Metabolic Imaging with Hyperpolarized [1-13C]Pyruvate. Front. Oncol. 2016, 6 (MAR), 1-6.
29. Shukla-Dave, A.; et al. Role of MRI in Prostate Cancer Detection. NMR Biomed. 2014, 27 (1), 16-24.
30. Theis, T.; et al. Microtesla SABRE Enables 10% Nitrogen-15 Nuclear Spin Polarization. J. Am. Chem. Soc. 2015, 137 (4), 1404-1407.
31. Tickner, B. J.; et al. Mechanistic Insight into Novel Sulfoxide Containing SABRE Polarisation Transfer Catalysts. Dalt. Trans. 2019, 48 (40), 15198-15206.
32. Tickner, B. J.; et al. Optimisation of Pyruvate Hyperpolarisation Using SABRE by Tuning the Active Magnetisation Transfer Catalyst. Catal. Sci. Technol. 2020, 10 (5), 1343-1355.
33. TomHon, P.; et al. Automated Pneumatic Shuttle for Magnetic Field Cycling and Parahydrogen Hyperpolarized Multidimensional NMR. J. Magn. Reson. 2020, 312, 106700.
34. Truong, M. L.; et al. 15N Hyperpolarization by Reversible Exchange Using SABRE-SHEATH. Journal of Physical Chemistry C. 2015, pp 8786-8797.
35. Vaeggemose, M.; et al. Comprehensive Literature Review of Hyperpolarized Carbon-13 Mri: The Road to Clinical Application. Metabolites 2021, 11 (4).

What is claimed is:

1. A method for hyperpolarization of a target molecule, the method comprising:

(a) transitioning a composition comprising the target molecule and a polarization transfer catalyst between a first state and a second state; and (b) contacting the composition with parahydrogen;

wherein, in the first state, hydrogen exchange rates for the target molecule are from about 1 Hz to about 100 Hz and substrate exchange is minimized or eliminated;

wherein, in the second state, rates of substrate exchange are up to about 100 Hz, and hydrogen exchange rates for the target molecule are comparable to rates of substrate exchange, and wherein the first state represents a low temperature and the second state represents a high temperature.

2. The method of claim 1, wherein the hyperpolarization is generated by signal amplification by reversible exchange (SABRE).

3. The method of claim 1, further comprising returning the composition to the first state and repeating the transitioning one or more times.

4. The method of claim 1, further comprising:

(c) exposing the composition to a magnetic field, wherein magnetic field strength is controlled by an external means;

wherein the external means comprises a radio frequency coil, a shielding mechanism, a solenoid powered with direct current, a permanent magnet array, a superconducting magnet, or a combination thereof.

5. The method of claim 1, wherein the target molecule comprises a metabolite, a drug molecule, a vitamin, a pyruvate analog, a combination thereof, or a salt thereof.

6. The method of claim 5, wherein the pyruvate analog comprises pyruvate, oxaloglutarate, oxaloacetate, phenyl pyruvate, 2-oxo-butyrate, 2,3-diketogluatarate, 2-oxo-adipate, or any combination thereof.

7. The method of claim 5, wherein the target molecule comprises acetonitrile, benzonitrile, α-cyano-4-hydroxycinnamic acid (CHCA), alectinib, metronidazole, dichloropyridazine, nicotinamide, imidazole, adenine, diphenyldiazene, diazirine, or any combination thereof.

8. The method of claim 5, wherein target molecule comprises

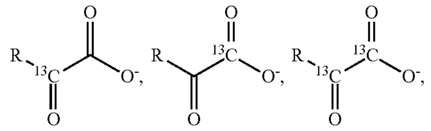

or any combination thereof;

wherein R is selected from substituted or unsubstituted C1-C10 alkyl, alkylaryl, aryl, heteroalkyl, heteroaryl, or any combination thereof.

9. The method of claim 1, wherein the low temperature is about-50° C. and the high temperature is about 100° C.

10. The method of claim 1, wherein the low temperature is about-10° C. and the high temperature is about 25° C.

11. The method of claim 1, wherein the parahydrogen has at least 50% purity.

12. The method of claim 1, wherein the composition further comprises a co-ligand, wherein the co-ligand comprises DMSO, ammonia, benzylamine, water, or any combination thereof.

13. The method of claim 1, wherein the polarization transfer catalyst comprises a metal center coordinated with an organic ligand, wherein the metal center comprises iridium, rhodium, cobalt, or any combination thereof.

14. The method of claim 1, wherein the composition comprises from about 5 to about 100 mM target molecule, about 1-20 mM of the polarization transfer catalyst, and, if present, about 5-600 mM of the co-ligand.

15. The method of claim 1, wherein the target molecule comprises at least one isotopic label, wherein the at least one isotopic label comprises $^{13}C$, $^{15}N$, $^{19}F$, $^{1}H$, $^{31}P$, or any combination thereof.

16. A hyperpolarized target molecule prepared according to the method of claim 1.

17. A contrast agent comprising the hyperpolarized target molecule of claim 16.

18. A method for diagnosing a disease or monitoring progress of treatment of a disease in a subject, the method comprising: (a) administering the hyperpolarized target molecule of claim 16 or the contrast agent of claim 17 to the subject; and (b) performing imaging on the subject, wherein performing imaging enables visualization of the hyperpolarized target molecule in the subject.

19. The method of claim 18, wherein the disease comprises cancer, cardiovascular disease, or a metabolic disorder.

20. The method of claim 18, wherein the imaging is magnetic resonance imaging (MRI).

* * * * *